(12) United States Patent  (10) Patent No.: US 7,576,388 B1
Wilson et al.  (45) Date of Patent: Aug. 18, 2009

(54) TRENCH-GATE LDMOS STRUCTURES

(75) Inventors: Peter H. Wilson, Boulder Creek, CA (US); Steven Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 73 days.

(21) Appl. No.: 10/951,259

(22) Filed: Sep. 26, 2004

Related U.S. Application Data

(63) Continuation-in-part of application No. 10/269,126, filed on Oct. 3, 2002, now Pat. No. 7,033,891.

(60) Provisional application No. 60/506,194, filed on Sep. 26, 2003.

(51) Int. Cl.
    H01L 29/78 (2006.01)
(52) U.S. Cl. .............................. 257/330; 257/E29.258; 257/E29.268
(58) Field of Classification Search ......... 257/328–341, 257/E29.258, E29.268
    See application file for complete search history.

(56) References Cited

U.S. PATENT DOCUMENTS

| | | |
|---|---|---|
| 3,404,295 A | 10/1968 | Warner et al. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |

(Continued)

FOREIGN PATENT DOCUMENTS

CN  1036666 A  10/1989

(Continued)

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

(Continued)

*Primary Examiner*—Lynne Gurley
*Assistant Examiner*—Colleen A Matthews
(74) *Attorney, Agent, or Firm*—Townsend and Townsend and Crew LLP

(57) ABSTRACT

MOSFET devices for RF applications that use a trench-gate in place of the lateral gate conventionally used in lateral MOSFET devices. A trench-gate provides devices with a single, short channel for high frequency gain. Embodiments of the present invention provide devices with an asymmetric oxide in the trench gate, as well as LDD regions that lower the gate-drain capacitance for improved RF performance. Refinements to these TG-LDMOS devices include placing a source-shield conductor below the gate and placing two gates in a trench-gate region. These improve device high-frequency performance by decreasing gate-to-drain capacitance. Further refinements include adding a charge balance region to the LDD region and adding source-to-substrate or drain-to-substrate vias.

12 Claims, 31 Drawing Sheets

U.S. PATENT DOCUMENTS

| | | | |
|---|---|---|---|
| 4,445,202 A | 4/1984 | Goetze et al. | |
| 4,568,958 A | 2/1986 | Baliga | |
| 4,579,621 A | 4/1986 | Hine | |
| 4,636,281 A | 1/1987 | Buiguez et al. | |
| 4,638,344 A | 1/1987 | Cardwell, Jr. | |
| 4,639,761 A | 1/1987 | Singer et al. | |
| 4,673,962 A | 6/1987 | Chatterjee et al. | |
| 4,698,653 A | 10/1987 | Cardwell, Jr. | |
| 4,716,126 A | 12/1987 | Cogan | |
| 4,745,079 A | 5/1988 | Pfiester | |
| 4,746,630 A | 5/1988 | Hui et al. | |
| 4,754,310 A | 6/1988 | Coe | |
| 4,767,722 A | 8/1988 | Blanchard | |
| 4,774,556 A | 9/1988 | Fujii et al. | |
| 4,801,986 A | 1/1989 | Chang et al. | |
| 4,821,095 A | 4/1989 | Temple | |
| 4,823,176 A | 4/1989 | Baliga et al. | |
| 4,824,793 A | 4/1989 | Richardson et al. | |
| 4,853,345 A | 8/1989 | Himelick | |
| 4,868,624 A | 9/1989 | Grung et al. | |
| 4,893,160 A | 1/1990 | Blanchard | |
| 4,914,058 A | 4/1990 | Blanchard | |
| 4,941,026 A | 7/1990 | Temple | |
| 4,961,100 A | 10/1990 | Baliga et al. | |
| 4,967,245 A | 10/1990 | Cogan et al. | |
| 4,969,028 A | 11/1990 | Baliga | |
| 4,974,059 A | 11/1990 | Kinzer | |
| 4,990,463 A | 2/1991 | Mori | |
| 4,992,390 A | 2/1991 | Chang | |
| 5,023,196 A | 6/1991 | Johnsen et al. | |
| 5,027,180 A | 6/1991 | Nishizawa et al. | |
| 5,034,785 A | 7/1991 | Blanchard | |
| 5,065,273 A | 11/1991 | Rajeevakumar | |
| 5,071,782 A | 12/1991 | Mori | |
| 5,072,266 A | 12/1991 | Bulucea | |
| 5,079,608 A | 1/1992 | Wodarczyk et al. | |
| 5,105,243 A | 4/1992 | Nakagawa et al. | |
| 5,111,253 A | 5/1992 | Korman et al. | |
| 5,134,448 A | 7/1992 | Johnsen et al. | |
| 5,142,640 A | 8/1992 | Iwamatsu | |
| 5,156,989 A | 10/1992 | Williams et al. | |
| 5,164,325 A | 11/1992 | Cogan et al. | |
| 5,164,802 A | 11/1992 | Jones et al. | |
| 5,168,331 A | 12/1992 | Yilmaz | |
| 5,168,973 A | 12/1992 | Asayama et al. | |
| 5,188,973 A | 2/1993 | Omura et al. | |
| 5,208,657 A | 5/1993 | Chatterjee et al. | |
| 5,216,275 A | 6/1993 | Chen | |
| 5,219,777 A | 6/1993 | Kang | |
| 5,219,793 A | 6/1993 | Cooper et al. | |
| 5,233,215 A | 8/1993 | Baliga | |
| 5,242,845 A | 9/1993 | Baba et al. | |
| 5,250,450 A | 10/1993 | Lee et al. | |
| 5,252,848 A | 10/1993 | Adler et al. | |
| 5,262,336 A | 11/1993 | Pike, Jr. et al. | |
| 5,268,311 A | 12/1993 | Euen et al. | |
| 5,275,961 A | 1/1994 | Smayling et al. | |
| 5,275,965 A | 1/1994 | Manning | |
| 5,281,548 A | 1/1994 | Prall | |
| 5,283,201 A | 2/1994 | Tsang et al. | |
| 5,294,824 A | 3/1994 | Okada | |
| 5,298,761 A | 3/1994 | Cogan et al. | |
| 5,300,447 A | 4/1994 | Anderson | |
| 5,300,452 A | 4/1994 | Chang et al. | |
| 5,326,711 A | 7/1994 | Malhi | |
| 5,346,834 A | 9/1994 | Hisamoto et al. | |
| 5,350,937 A | 9/1994 | Yamazaki et al. | |
| 5,365,102 A | 11/1994 | Mehrotra et al. | |
| 5,366,914 A | 11/1994 | Takahashi et al. | |
| 5,389,815 A | 2/1995 | Takahashi | |
| 5,405,794 A | 4/1995 | Kim | |
| 5,418,376 A | 5/1995 | Muraoka et al. | |
| 5,424,231 A | 6/1995 | Yang | |
| 5,429,977 A | 7/1995 | Lu et al. | |
| 5,430,311 A | 7/1995 | Murakami et al. | |
| 5,430,324 A | 7/1995 | Bencuya | |
| 5,434,435 A * | 7/1995 | Baliga | 257/141 |
| 5,436,189 A | 7/1995 | Beasom | |
| 5,438,007 A | 8/1995 | Vinal et al. | |
| 5,438,215 A | 8/1995 | Tihanyi | |
| 5,442,214 A | 8/1995 | Yang | |
| 5,473,176 A | 12/1995 | Kakumoto | |
| 5,473,180 A | 12/1995 | Ludikhuize | |
| 5,474,943 A | 12/1995 | Hshieh et al. | |
| 5,488,010 A | 1/1996 | Wong | |
| 5,519,245 A | 5/1996 | Tokura et al. | |
| 5,532,179 A | 7/1996 | Chang et al. | |
| 5,541,425 A | 7/1996 | Nishihara | |
| 5,554,552 A | 9/1996 | Chi | |
| 5,554,862 A | 9/1996 | Omura et al. | |
| 5,567,634 A | 10/1996 | Hebert et al. | |
| 5,567,635 A | 10/1996 | Acovic et al. | |
| 5,572,048 A | 11/1996 | Sugawara | |
| 5,576,245 A | 11/1996 | Cogan et al. | |
| 5,578,851 A | 11/1996 | Hshieh et al. | |
| 5,581,100 A | 12/1996 | Ajit | |
| 5,583,065 A | 12/1996 | Miwa | |
| 5,592,005 A | 1/1997 | Floyd et al. | |
| 5,593,909 A | 1/1997 | Han et al. | |
| 5,595,927 A | 1/1997 | Chen et al. | |
| 5,597,765 A | 1/1997 | Yilmaz et al. | |
| 5,605,852 A | 2/1997 | Bencuya | |
| 5,616,945 A | 4/1997 | Williams | |
| 5,623,152 A | 4/1997 | Majumdar et al. | |
| 5,629,543 A | 5/1997 | Hshieh et al. | |
| 5,637,898 A | 6/1997 | Baliga | |
| 5,639,676 A | 6/1997 | Hshieh et al. | |
| 5,640,034 A | 6/1997 | Malhi | |
| 5,648,670 A | 7/1997 | Blanchard | |
| 5,656,843 A | 8/1997 | Goodyear et al. | |
| 5,665,619 A | 9/1997 | Kwan et al. | |
| 5,670,803 A | 9/1997 | Beilstein, Jr. et al. | |
| 5,684,320 A | 11/1997 | Kawashima | |
| 5,689,128 A | 11/1997 | Hshieh et al. | |
| 5,693,569 A | 12/1997 | Ueno | |
| 5,705,409 A | 1/1998 | Witek | |
| 5,710,072 A | 1/1998 | Krautschneider et al. | |
| 5,714,781 A | 2/1998 | Yamamoto et al. | |
| 5,717,237 A | 2/1998 | Chi | |
| 5,719,409 A | 2/1998 | Singh et al. | |
| 5,744,372 A | 4/1998 | Bulucea | |
| 5,767,004 A | 6/1998 | Balasubramanian et al. | |
| 5,770,878 A | 6/1998 | Beasom | |
| 5,776,813 A | 7/1998 | Huang et al. | |
| 5,780,343 A | 7/1998 | Bashir | |
| 5,801,417 A | 9/1998 | Tsang et al. | |
| 5,814,858 A | 9/1998 | Williams | |
| 5,821,583 A | 10/1998 | Hshieh et al. | |
| 5,877,528 A | 3/1999 | So | |
| 5,879,971 A | 3/1999 | Witek | |
| 5,879,994 A | 3/1999 | Kwan et al. | |
| 5,894,157 A | 4/1999 | Han et al. | |
| 5,895,951 A | 4/1999 | So et al. | |
| 5,895,952 A | 4/1999 | Darwish et al. | |
| 5,897,343 A | 4/1999 | Mathew et al. | |
| 5,897,360 A | 4/1999 | Kawaguchi | |
| 5,900,663 A | 5/1999 | Johnson et al. | |
| 5,906,680 A | 5/1999 | Meyerson | |
| 5,907,776 A | 5/1999 | Hshieh et al. | |
| 5,912,490 A | 6/1999 | Hebert et al. | |
| 5,917,216 A | 6/1999 | Floyd et al. | |
| 5,929,481 A | 7/1999 | Hshieh et al. | |
| 5,943,581 A | 8/1999 | Lu et al. | |
| 5,949,104 A | 9/1999 | D'Anna et al. | |

| | | | | | | |
|---|---|---|---|---|---|---|
| 5,949,124 | A | 9/1999 | Hadizad et al. | 6,271,552 | B1 | 8/2001 | D'Anna |
| 5,959,324 | A | 9/1999 | Kohyama | 6,271,562 | B1 | 8/2001 | Deboy et al. |
| 5,960,271 | A | 9/1999 | Wollesen et al. | 6,274,904 | B1 | 8/2001 | Tihanyi |
| 5,972,741 | A | 10/1999 | Kubo et al. | 6,274,905 | B1 | 8/2001 | Mo |
| 5,973,360 | A | 10/1999 | Tihanyi | 6,277,706 | B1 | 8/2001 | Ishikawa |
| 5,973,367 | A | 10/1999 | Williams | 6,281,547 | B1 | 8/2001 | So et al. |
| 5,976,936 | A | 11/1999 | Miyajima et al. | 6,285,060 | B1 | 9/2001 | Korec et al. |
| 5,977,591 | A | 11/1999 | Fratin et al. | 6,291,298 | B1 | 9/2001 | Williams et al. |
| 5,981,344 | A | 11/1999 | Hshieh et al. | 6,291,856 | B1 | 9/2001 | Miyasaka et al. |
| 5,981,996 | A | 11/1999 | Fujishima | 6,294,818 | B1 | 9/2001 | Fujihira |
| 5,998,833 | A | 12/1999 | Baliga | 6,297,534 | B1 | 10/2001 | Kawaguchi et al. |
| 6,005,271 | A | 12/1999 | Hshieh | 6,303,969 | B1 | 10/2001 | Tan |
| 6,008,097 | A | 12/1999 | Yoon et al. | 6,307,246 | B1 | 10/2001 | Nitta et al. |
| 6,011,298 | A | 1/2000 | Blanchard | 6,309,920 | B1 | 10/2001 | Laska et al. |
| 6,015,727 | A | 1/2000 | Wanlass | 6,313,482 | B1 | 11/2001 | Baliga |
| 6,020,250 | A | 2/2000 | Kenney et al. | 6,316,806 | B1 | 11/2001 | Mo |
| 6,034,415 | A | 3/2000 | Johnson et al. | 6,326,656 | B1 | 12/2001 | Tihanyi |
| 6,037,202 | A | 3/2000 | Witek | 6,337,499 | B1 | 1/2002 | Werner |
| 6,037,628 | A | 3/2000 | Huang | 6,346,464 | B1 | 2/2002 | Takeda et al. |
| 6,037,632 | A | 3/2000 | Omura et al. | 6,346,469 | B1 | 2/2002 | Greer |
| 6,040,600 | A | 3/2000 | Uenishi et al. | 6,351,018 | B1 | 2/2002 | Sapp |
| 6,048,772 | A | 4/2000 | D'Anna | 6,353,252 | B1 * | 3/2002 | Yasuhara et al. ............ 257/487 |
| 6,049,108 | A | 4/2000 | Williams et al. | 6,359,308 | B1 | 3/2002 | Hijzen et al. |
| 6,051,488 | A | 4/2000 | Lee et al. | 6,362,112 | B1 | 3/2002 | Hamerski |
| 6,057,558 | A | 5/2000 | Yamamoto et al. | 6,362,505 | B1 | 3/2002 | Tihanyi |
| 6,063,678 | A | 5/2000 | D'Anna | 6,365,462 | B2 | 4/2002 | Baliga |
| 6,064,088 | A | 5/2000 | D'Anna | 6,365,930 | B1 | 4/2002 | Schillaci et al. |
| 6,066,878 | A | 5/2000 | Neilson | 6,368,920 | B1 | 4/2002 | Beasom |
| 6,069,043 | A | 5/2000 | Floyd et al. | 6,368,921 | B1 | 4/2002 | Hijzen et al. |
| 6,077,733 | A | 6/2000 | Chen et al. | 6,376,314 | B1 | 4/2002 | Jerred |
| 6,081,009 | A | 6/2000 | Neilson | 6,376,315 | B1 | 4/2002 | Hshieh et al. |
| 6,084,264 | A | 7/2000 | Darwish | 6,376,878 | B1 | 4/2002 | Kocon |
| 6,084,268 | A | 7/2000 | de Frésart et al. | 6,376,890 | B1 | 4/2002 | Tihanyi |
| 6,087,232 | A | 7/2000 | Kim et al. | 6,384,456 | B1 | 5/2002 | Tihanyi |
| 6,096,608 | A | 8/2000 | Williams | 6,388,286 | B1 | 5/2002 | Baliga |
| 6,097,063 | A | 8/2000 | Fujihira | 6,388,287 | B2 | 5/2002 | Deboy et al. |
| 6,103,578 | A | 8/2000 | Uenishi et al. | 6,400,003 | B1 | 6/2002 | Huang |
| 6,103,619 | A | 8/2000 | Lai | 6,426,260 | B1 | 7/2002 | Hshieh |
| 6,104,054 | A | 8/2000 | Corsi et al. | 6,429,481 | B1 | 8/2002 | Mo et al. |
| 6,110,799 | A | 8/2000 | Huang | 6,433,385 | B1 | 8/2002 | Kocon et al. |
| 6,114,727 | A | 9/2000 | Ogura et al. | 6,436,779 | B2 | 8/2002 | Hurkx et al. |
| 6,137,152 | A | 10/2000 | Wu | 6,437,399 | B1 | 8/2002 | Huang |
| 6,150,697 | A | 11/2000 | Teshigahara et al. | 6,441,454 | B2 | 8/2002 | Hijzen et al. |
| 6,156,606 | A | 12/2000 | Michaelis | 6,444,574 | B1 | 9/2002 | Chu |
| 6,156,611 | A | 12/2000 | Lan et al. | 6,452,230 | B1 | 9/2002 | Boden, Jr. |
| 6,163,052 | A | 12/2000 | Liu et al. | 6,461,918 | B1 | 10/2002 | Calafut |
| 6,165,870 | A | 12/2000 | Shim et al. | 6,465,304 | B1 | 10/2002 | Blanchard et al. |
| 6,168,983 | B1 | 1/2001 | Rumennik et al. | 6,465,843 | B1 | 10/2002 | Hirler et al. |
| 6,168,996 | B1 | 1/2001 | Numazawa et al. | 6,465,869 | B2 | 10/2002 | Ahlers et al. |
| 6,171,935 | B1 | 1/2001 | Nance et al. | 6,472,678 | B1 | 10/2002 | Hshieh et al. |
| 6,174,769 | B1 | 1/2001 | Lou | 6,472,708 | B1 | 10/2002 | Hshieh et al. |
| 6,174,773 | B1 | 1/2001 | Fujishima | 6,475,884 | B2 | 11/2002 | Hshieh et al. |
| 6,174,785 | B1 | 1/2001 | Parekh et al. | 6,476,443 | B1 | 11/2002 | Kinzer |
| 6,184,545 | B1 | 2/2001 | Werner et al. | 6,479,352 | B2 | 11/2002 | Blanchard |
| 6,184,555 | B1 | 2/2001 | Tihanyi et al. | 6,489,652 | B1 | 12/2002 | Jeon et al. |
| 6,188,104 | B1 | 2/2001 | Choi et al. | 6,501,146 | B1 | 12/2002 | Harada |
| 6,188,105 | B1 | 2/2001 | Kocon et al. | 6,534,825 | B2 | 3/2003 | Calafut |
| 6,190,978 | B1 | 2/2001 | D'Anna | 6,566,804 | B1 | 5/2003 | Trujillo et al. |
| 6,191,447 | B1 | 2/2001 | Baliga | 6,580,123 | B2 | 6/2003 | Thapar |
| 6,194,741 | B1 | 2/2001 | Kinzer et al. | 6,608,350 | B2 | 8/2003 | Kinzer et al. |
| 6,198,127 | B1 | 3/2001 | Kocon | 6,657,254 | B2 | 12/2003 | Hshieh et al. |
| 6,201,279 | B1 | 3/2001 | Pfirsch | 6,677,641 | B2 | 1/2004 | Kocon |
| 6,204,097 | B1 | 3/2001 | Shen et al. | 6,683,346 | B2 | 1/2004 | Zeng |
| 6,207,994 | B1 | 3/2001 | Rumennik et al. | 6,710,403 | B2 * | 3/2004 | Sapp ........................ 257/330 |
| 6,222,229 | B1 | 4/2001 | Hebert et al. | 6,720,616 | B2 | 4/2004 | Hirler et al. |
| 6,222,233 | B1 | 4/2001 | D'Anna | 6,734,066 | B2 | 5/2004 | Lin et al. |
| 6,225,649 | B1 | 5/2001 | Minato | 6,762,127 | B2 | 7/2004 | Boiteux et al. |
| 6,228,727 | B1 | 5/2001 | Lim et al. | 6,806,533 | B2 | 10/2004 | Henninger et al. |
| 6,239,463 | B1 | 5/2001 | Williams et al. | 6,815,293 | B2 * | 11/2004 | Disney et al. ............... 438/268 |
| 6,239,464 | B1 | 5/2001 | Tsuchitani et al. | 6,833,584 | B2 | 12/2004 | Henninger et al. |
| 6,265,269 | B1 | 7/2001 | Chen et al. | 2001/0023961 | A1 | 9/2001 | Hshieh et al. |
| 6,271,082 | B1 | 8/2001 | Hou et al. | 2001/0026989 | A1 | 10/2001 | Thapar |
| 6,271,100 | B1 | 8/2001 | Ballantine et al. | 2001/0028083 | A1 | 10/2001 | Onishi et al. |

| | | | |
|---|---|---|---|
| 2001/0032998 A1 | 10/2001 | Iwamoto et al. | |
| 2001/0041400 A1 | 11/2001 | Ren et al. | |
| 2001/0049167 A1 | 12/2001 | Madson | |
| 2001/0050394 A1 | 12/2001 | Onishi et al. | |
| 2002/0008284 A1 | 1/2002 | Zeng | |
| 2002/0009832 A1 | 1/2002 | Blanchard | |
| 2002/0014658 A1 | 2/2002 | Blanchard | |
| 2002/0066924 A1 | 6/2002 | Blanchard | |
| 2002/0070418 A1 | 6/2002 | Kinzer et al. | |
| 2002/0100933 A1 | 8/2002 | Marchant | |
| 2003/0060013 A1 | 3/2003 | Marchant | |
| 2003/0132450 A1 | 7/2003 | Minato et al. | |
| 2003/0193067 A1 | 10/2003 | Kim | |
| 2003/0209757 A1 | 11/2003 | Henninger et al. | |
| 2004/0031987 A1* | 2/2004 | Henninger et al. | 257/328 |
| 2004/0089910 A1 | 5/2004 | Hirler et al. | |
| 2004/0121572 A1 | 6/2004 | Darwish et al. | |
| 2004/0232407 A1 | 11/2004 | Calafut | |
| 2005/0017293 A1 | 1/2005 | Zundel et al. | |

FOREIGN PATENT DOCUMENTS

| | | |
|---|---|---|
| DE | 4300806 C1 | 12/1993 |
| DE | 19736981 A1 | 8/1998 |
| EP | 0975024 A2 | 1/2000 |
| EP | 1026749 A1 | 8/2000 |
| EP | 1054451 A2 | 11/2000 |
| EP | 0747967 B1 | 2/2002 |
| EP | 1205980 A1 | 5/2002 |
| JP | 56-058267 A | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05-226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |

OTHER PUBLICATIONS

Baliga "Options for CVD of Dielectrics Include Low-k Materials," Technical Literature from Semiconductor International, Jun. 1998, 4 pages total.

Baliga et al., "Improving the reverse recovery of power MOSFET Integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm$^2$," IEEE Transactions on Electron Devices 34:2329-2334 (1987).

Cheng et al., "Fast reverse recovery body diode in high-voltage VDMOSFET using cell-distributed schottky contacts," ( May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf. (PESC)*, pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD 2000, May 22-25, Toulouse France, pp. 197-200.

"IR develops CoolMOS™-equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1998, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with integrated schottky diode," (1989) *Proc. IEEE Power Electronics Specialist Conf. (PESC)*, pp. 176-179.

Lorenz et al., "COOL MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pp. 1-11, Vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al. "Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atrnospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

UEDA et al. "An Ultra-Law On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf et al., "Silicon Processing for The VLSI Era" vol. 1—Process Technology, Second Edition, (1990), pp. 658.

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

Baliga "New Concepts in Power Rectifiers," Physics of Semiconductor Devices, Proceedings of the Third Int'l Workshop, Madras (India), Committe on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

* cited by examiner

TRENCH-GATE LDMOS STRUCTURES

CROSS-REFERENCES TO RELATED APPLICATIONS

This application claims the benefit of U.S. provisional application 60/506,194, filed Sep. 26, 2003, and is a Continuation-in-Part of U.S. patent application Ser. No. 10/269,126, filed Oct. 3, 2002.

The following patent applications are commonly assigned with the present application and are incorporated in their entirety herein by reference:

U.S. patent application Ser. No. 10/269,126, entitled "Trench Gate Laterally Diffused MOSFET Devices and Methods for Making Such Devices", filed Oct. 3, 2002; and U.S. patent application Ser. No. 60/405,369, entitled "Improved MOS Gating Method for Reduced Miller Capacitance and Switching Losses", filed Aug. 23, 2002.

BACKGROUND

The invention generally relates to methods for fabricating integrated circuits (ICs) and semiconductor devices and the resulting structures. More particularly, the invention relates to metal oxide semiconductor-field-effect transistor (MOSFET) devices and methods for making such devices. Even more particularly, the invention relates to improvements that may be made to trench-gate laterally-diffused MOSFET devices and methods for making such improved devices.

In IC fabrication, devices such as transistors may be formed on a semiconductor wafer or substrate, which is typically made of silicon. MOSFET devices are widely used in numerous electronic apparatus, including automotive electronics, disk drives and power supplies. Generally, these apparatus function as switches and are used to connect a power supply to a load.

One of the applications in which MOSFET devices have been used is for radio frequency (RF) applications. Such RF MOSFET devices are generally lateral transistors. See, for example, the lateral MOSFET device described in U.S. Pat. No. 5,949,104, as well as the device illustrate in FIG. 1. Such lateral MOSFET devices often have a diffused source that allows a backside contact for improved thermal conducting and reduced parasitics.

Recent advances in lateral (or laterally-diffused) MOSFET (LDMOS) devices have improved the performance and cost characteristics of lateral MOSFET devices when compared to vertical MOSFET devices for RF power amplifiers in base stations applications. Such RF LDMOS devices have been particularly useful for wireless base station applications. The RF vertical (or vertically-diffused) VDMOS structure unfortunately suffers from certain limitations relative to the LDMOS such as high output capacitance (which decreases efficiency), decreased power gain, narrowing of the usable bandwidth, and source inductance that decreases the operating efficiency.

Thus, what is needed are circuits, methods, and apparatus that provide an improved LDMOS having reduced output capacitance, increased power gain, and more useable bandwidth.

SUMMARY

Embodiments of the present invention provide MOSFET devices for RF applications that use a trench-gate in place of the lateral gate conventionally used in lateral MOSFET devices. A trench-gate provides devices with a single, short channel for high frequency gain. Embodiments of the present invention provide devices with an asymmetric oxide in the trench gate, as well as LDD regions that lower the gate-drain capacitance for improved RF performance. Such features allow these devices to maintain the advantages of the LDMOS structure such as better linearity, thereby increasing the RF power gain. The trench-gate LDMOS (TG-LDMOS) of the invention also reduces the hot carrier effects when compared to regular LDMOS devices by reducing the peak electric field and impact ionization.

Refinements to these TG-LDMOS devices include placing a source-shield conductor below the gate and placing two gates in a trench-gate region. These improve device high-frequency performance by decreasing gate-to-drain capacitance. Further refinements include adding a charge balance region to the LDD region and adding source-to-substrate or drain-to-substrate vias. Various embodiments of the present invention may incorporate one or more of these or the other features described herein.

An exemplary embodiment of the present invention provides a MOSFET. This MOSFET includes a first silicon region of a first conductivity type, the first silicon region having a surface, and a gate-trench region extending from the surface of the first silicon region into the first silicon region. The gate trench region includes a source-shield region including a first conductive region, and a gate region comprising a second conductive region and between the surface of the first silicon region and the source-shield region. The gate-trench region has an asymmetric insulating layer along two of its opposing sidewalls. The MOSFET further includes a source region including a dopant region of a second conductivity type, the dopant region laterally extending along one side of the gate trench region and contacting a source electrode; and a lightly-doped drain region of the second conductivity type laterally extending below and along an opposing side of the one side of the gate trench region and contacting a drain electrode.

Another exemplary embodiment provides another MOSFET. This transistor includes a first silicon region of a first conductivity type, the first silicon region having a surface, a gate-trench region extending from the surface of the first silicon region into the first silicon region. The gate trench region includes a first gate region comprising a first conductive region, a second gate region comprising a second conductive region and between the surface of the first silicon region and the first gate region. The gate-trench region has an asymmetric insulating layer along two of its opposing sidewalls. This device further includes a source region comprising a dopant region of a second conductivity type, the dopant region laterally extending along one side of the gate trench region and contacting a source electrode, and a lightly-doped drain region of the second conductivity type laterally extending below and along an opposing side of the one side of the gate trench region and contacting a drain electrode.

A further exemplary embodiment provides another MOSFET. This transistor includes a first silicon region of a first conductivity type, the first silicon region having a surface, a gate-trench region extending from the surface of the first silicon region into the first silicon region, the gate trench region including a gate region comprising a conductive region. The gate-trench region also including an asymmetric insulating layer along two of its opposing sidewalls. The device also includes a source region comprising a dopant region of a second conductivity type, the dopant region laterally extending along one side of the gate trench region and contacting a source electrode, and a lightly-doped drain region of the second conductivity type laterally extending below and along an opposing side of the one side of the gate trench region and contacting a drain electrode, the lightly-doped drain region comprising a charge-balance region of the first conductivity type.

A better understanding of the nature and advantages of the present invention may be gained with reference to the following detailed description and the accompanying drawings.

DESCRIPTION OF EXEMPLARY EMBODIMENTS

The following description provides specific details in order to provide a thorough understanding of the invention. The skilled artisan, however, would understand that the invention can be practiced without employing these specific details. Indeed, the invention can be practiced by modifying the illustrated system and method and can be used in conjunction with apparatus and techniques conventionally used in the industry. For example, the MOSFET devices are described for RF applications, but could be used in non-RF applications such as switching.

As noted above, the invention generally comprises a structure that combines the benefits of the LDMOS structure (i.e., a low gate-to-drain capacitance and a good linearity) with the benefits of a short gate channel. Thus, any structure that combines theses feature can be employed in the invention. In one embodiment of the present invention, these benefits are combined by using a trench gate laterally-diffused MOSFET device as described below. By using this structure, the breakdown capabilities of conventional LDMOS structure can be improved. In addition, the carrier effects (i.e., injection) are improved, and the peak electric field and impact ionization of the drain region is reduced.

Figure 1:
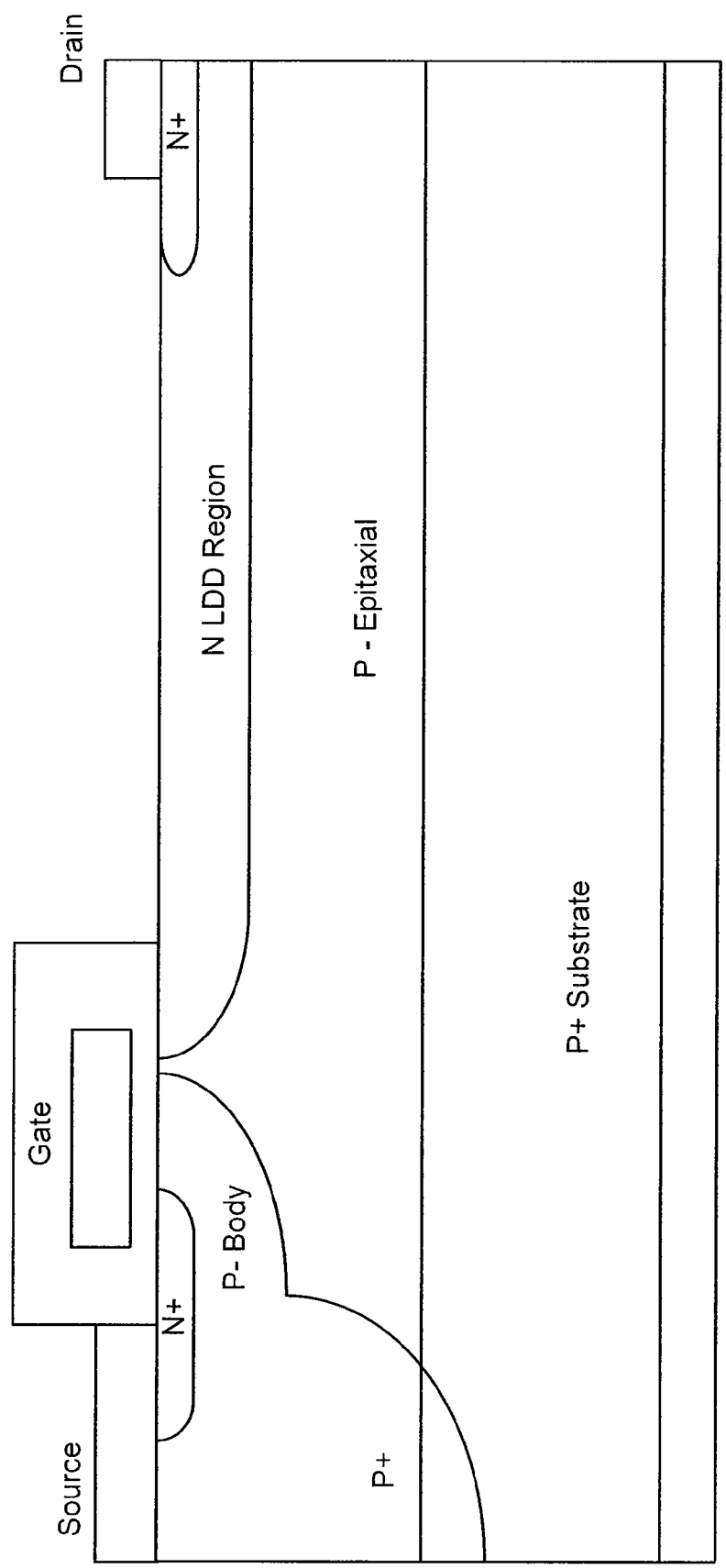
FIG. 1 illustrates a prior art MOSFET device.
Figure 2:
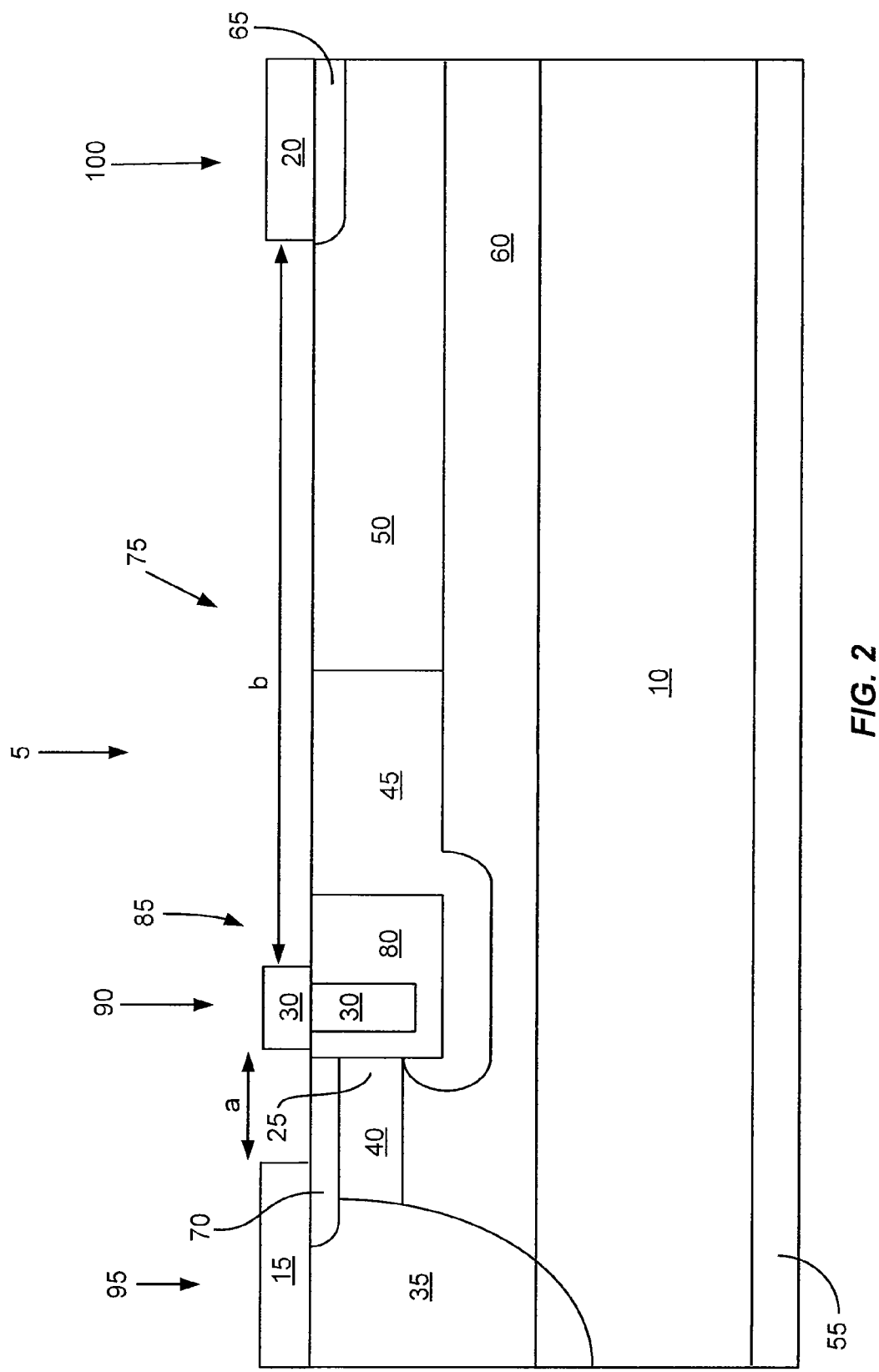
FIG. 2 illustrates a MOSFET device according to an embodiment of the present invention.

To achieve these benefits, the structure illustrated in the FIG. 2 is used in the invention. In FIG. 2, the MOSFET device 5 comprises a semiconductor substrate 10, typically of monocrystalline silicon (Si), with an epitaxial layer 60 formed thereon. In one embodiment of the present invention, the silicon substrate 10 can have a first conductivity type, such as B (boron), with a dopant concentration of about $2 \times 10^{19}$ atoms/cm3. In another embodiment of the present invention, the substrate can have a resistivity ranging from 0.005 to 0.01 ohm centimeter. A contact region 55 can be located on the "backside" of the substrate 10. In one embodiment of the present invention, the contact region 55 is a metal contact. In one embodiment of the present invention, the depth of the epitaxial layer 60 can range from about 3 to about 9 microns and can have a first conductivity dopant concentration of about $1.2 \times 10^{15}$ atoms/cm3. In another embodiment of the present invention, the epitaxial layer can have a resistivity ranging from about 20 to about 30 ohm centimeters.

A gate structure 90 is located between source region 95 and drain region 100. The gate structure 90 is separated from the source region 95 by a body region 40. And the gate structure 90 is separated from the drain region 100 by a lightly doped drain (LDD) region 75.

The gate structure 90 contains gate conductor 30, as well as an insulating layer 80 surrounding that part of the gate conductor 30 in the trench 85. The MOSFET device contains channel region 25 of a first conductivity type (p-type in one embodiment of the present invention) that is adjacent to the side of the insulating layer 80 of the gate structure 90 nearest the source region 95. Because of this configuration of the gate in the trench 85, the gate structure 90 is often referred to as a trench gate in which length of the gate is controlled by the depth of the trench 85. In one embodiment of the present invention, the trench depth can range from about 0.5 to about 4.0 microns. In another embodiment of the present invention, the depth of the trench can be about 1 to about 2 microns. In yet another embodiment of the present invention, the trench depth can be about 1.5 microns.

With this configuration of the gate structure 90, the thin insulating layer between the channel region 25 and the conducting layer 30 operates as a high-quality gate insulating layer. In addition, the insulating layer 80 (which in some embodiments of the invention is asymmetric) can also reduce the gate to drain capacitance (Cgd). As well, the thick bottom oxide (with a thickness of about 1 kÅ to about 4 kÅ) can reduce the gate-to-drain overlap capacitance and thereby lower the gate charge.

By applying a positive gate voltage to device 5, the channel region 25 can change the polarity from a first conductivity type to a second conductivity type. This polarity change—called inversion—permits the carriers to drift (e.g., flow) from the dopant region 70 to the lightly doped drain (LDD) region 75. Thus, the channel region 25 can be modulated by a positive gate voltage.

Source region 95 comprises dopant region 35 and source electrode 15. The dopant region 35 is typically of a first conductivity type with a concentration ranging from about $5 \times 10^{15}$ to about $1 \times 10^{19}$ atoms/cm3. In one embodiment of the present invention, the concentration of dopant region 35 is about $1 \times 10^{19}$ atoms/cm3. The source electrode 15 is located over dopant region 35 and overlaps body region 40. The body region 40 is typically of a first conductivity type with a concentration greater than or equal to the concentration of the epitaxial layer 60. In one embodiment of the present invention, the concentration of body region 40 is about $2.5 \times 10^{15}$ atoms/cm3.

As known in the art, source electrode 15 can be separated from the body region 40 by dopant region 70 of a second conductivity type. As well, the source electrode 15 can be separated from the gate structure 90 by a distance (a) that depends on the desired characteristics of the gate. Generally, this distance (a) can range from about 0.5 to about 1.5 microns.

The drain region 100 contains a drain electrode 20 overlying a portion of LDD region 75. In one embodiment of the present invention, the drain electrode 20 is separated from the gate by a distance (b) depending on the desired drain-source breakdown voltage. In one embodiment of the present invention, this distance typically can be between about 3 to about 5 microns. In another embodiment of the present invention, the drain electrode is separated from gate by a distance of about 4 microns. The drain electrode 20 is also separated from the LDD region 75 by a dopant region 65. In one embodiment of the present invention, the dopant region 65 is of a second conductivity type with a concentration of ranging from about $1 \times 10^{15}$ to $1 \times 10^{16}$ atoms/cm3.

The LDD region 75 contains a first drain drift region 45 of the MOS structure. The first drain drift region 45 is formed completely within the epitaxial layer 60, with a part underlying the trench 85. In one embodiment of the present invention, the first enhanced drain drift region 45 has second conductivity type when the epitaxial layer 60 has a first conductivity type. In one embodiment of the present invention, the first enhanced drain drift region 45 can have a dopant concentration ranging from about $1 \times 10^{11}$ to about $5 \times 10^{13}$ atoms/cm3. In another embodiment of the present invention, this dopant concentration is about $2 \times 10^{12}$ atoms/cm3. The first enhanced drain region 45 can have lateral dimensions ranging from about 0.5 to about 5.0 microns and vertical dimensions ranging from about 0.2 to about 0.5 microns The LDD region 75 also contains a second enhanced drain drift region 50 that is adjacent to and contacting the first drain drift region 45. The second drain drift region 50 is also formed completely within the epitaxial layer 60. In one embodiment of the present invention, the second drain drift region 50 has second conductivity type when the epitaxial layer 60 has a first conductivity type. In one embodiment of the present invention, the second drain drift region can have a dopant concentration greater than the first drain drift region 45. In one embodiment of the present invention, the dopant concentration can range from about $1 \times 10^{11}$ to about $1 \times 10^{14}$ atoms/cm3. In another embodiment of the present invention, this dopant concentration is about $1 \times 10^{13}$ atoms/cm3. The second drain region 50 can have lateral dimensions ranging from more than 0 to about 5 microns and vertical dimensions substantially similar to the first drain drift region 45.

Using the two drain drift regions 45 and 50 in LDD region 75 allows one to increase the maximum drain drift current density of the device, as well as increase the drain-to-source breakdown voltage. Indeed, the effective electrical field in the LDD region 75 is strong enough to cause the avalanche effect of carrier multiplication at certain critical concentration of carriers. Thus, the critical carrier concentration can be related to the breakdown voltage in device 5. In one embodiment of the present invention, three or more drift regions that are uniformly graded from a light dopant concentration to a heavier dopant concentration can be used as LDD region 75.

In one embodiment of the present invention, the second drain drift region 50 has a concentration higher than the concentration of the first drain drift region 45. This configuration can result in the redistribution of the critical electrical fields in the channel region 25 and can result in an increase of the drain-to-source breakdown voltage. The maximum current density in the source-drain channel of the device can also be increased when the total concentration in the drain drift region is increased.

Using the two drain drift regions 45 and 50 also allows the LDD region 75 to act as a non-linear resistor, especially when the applied voltage is varied. This non-linear behavior suggests the existence of a pinch-off point in the LDD region 75. In other words, as the applied voltage is increase, the depletion region present in the LDD region 75 can expand and lead to a pinch-off point.

Configuring the LDD region 75 as indicated above can also be used to support efficient operation of device 5. The dopant profile of the LDD region 75 can be controlled by having different sectors each with a different dopant concentration. The different doping concentrations can be configured to ensure that any breakdown does not occur near the upper surface of the device, but deeper within the LDD region 75 near the interface of the dopant region 65 and LDD region 75. The ability to configure the LDD region 75 in this manner must be carefully balanced, of course, with the other operating parameters of the device such as Cgd and the drain to source capacitance (Cds).

As noted above, the drift drain region 45 extends under the trench 85. In one embodiment of the present invention, the dopant concentration of the region under the trench 85 should be higher than the concentration of the remainder of LDD region 75. This region is an extension of LDD region 75 and helps create a current flow from the drain to the source. The concentration of this region should be tailored to the required drain-source breakdown voltage, as well as to not to substantially increase the gate to drain capacitance.

By using a trench gate, the devices of the invention are able to achieve several improvements over existing LDMOS devices. First, the devices of the invention have an improved RF power gain and efficiency due to the reduction of the Cgd resulting from the asymmetric insulating material in the trench and the shorter channel. Second, the devices of the invention are able to reduce the hot carrier effects by reducing the peak electric field. Third, the operating voltages of the devices of the invention can be increased above the capabilities of existing LDMOS devices.

Figure 4:
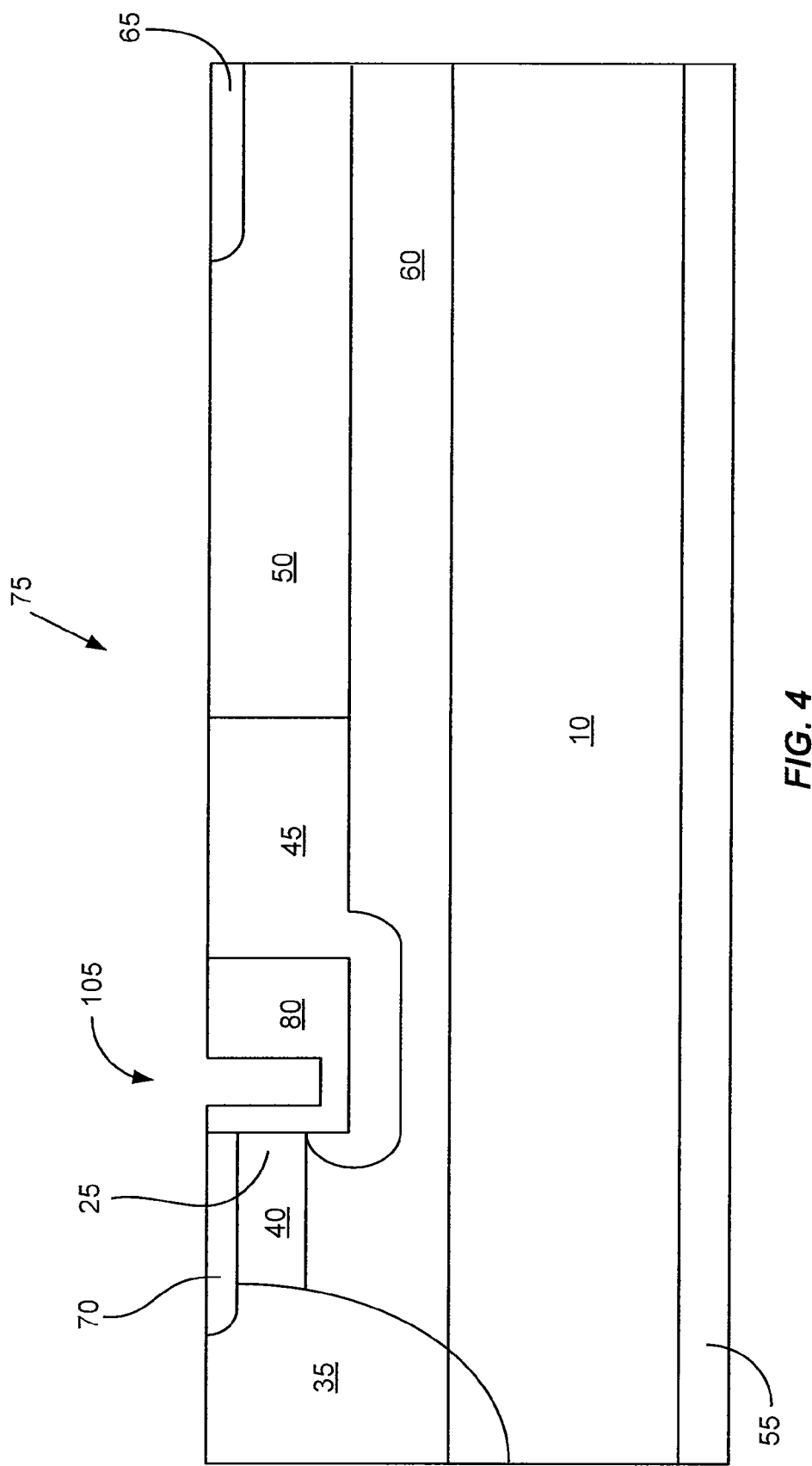
Figure 5:
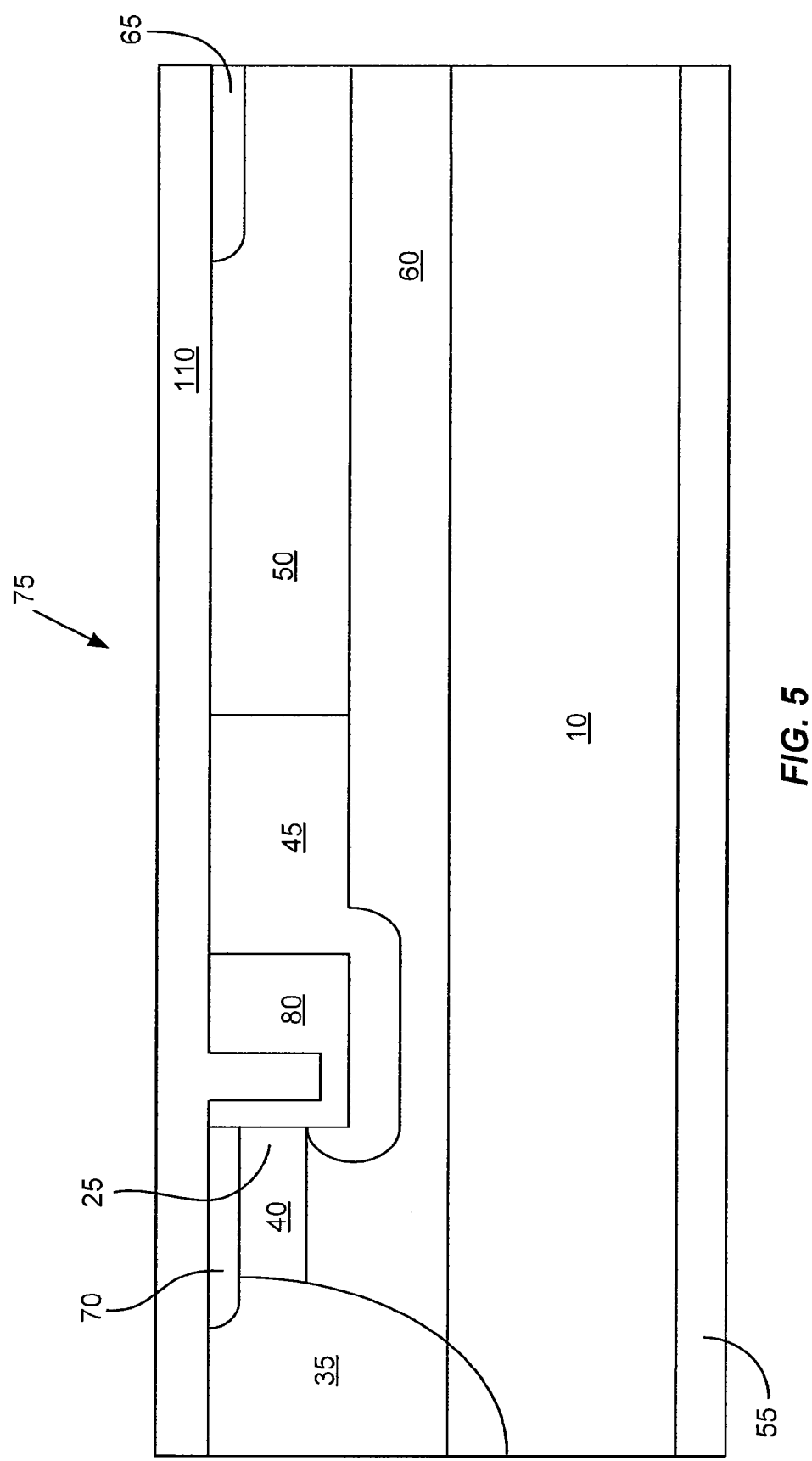

The device illustrated in FIG. 2 can be made by any process resulting in the depicted structure. In one embodiment of the present invention, the process described below and illustrated in FIGS. 3-5 is used to make the structure depicted in FIG. 2.

Figure 3:
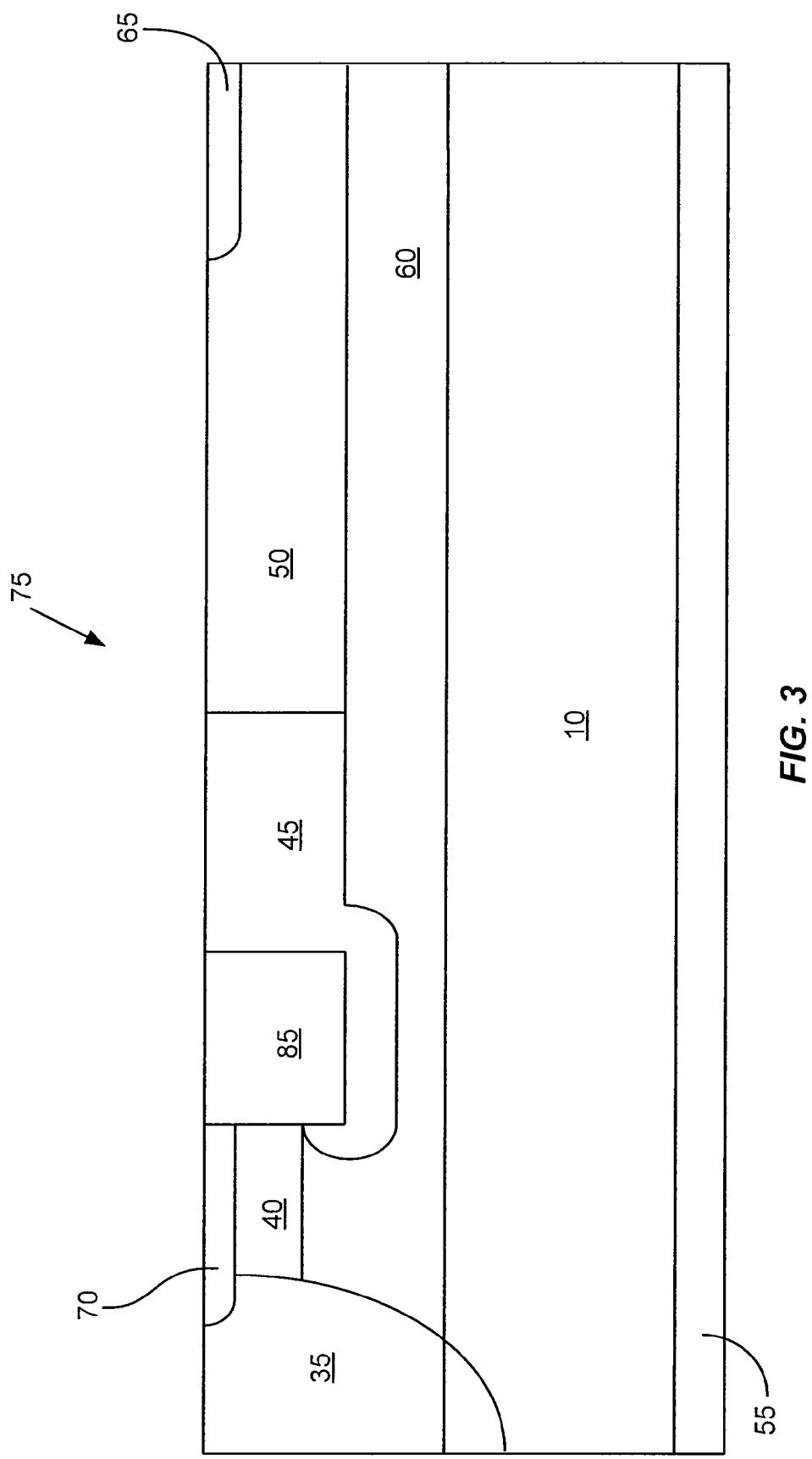
FIGS. 3-5 illustrate a MOSFET device according to an embodiment of the present invention at various processing stages during manufacture.

Referring to FIG. 3, the process begins with substrate 10. Any substrate known in the art can be used in the invention. Suitable substrates include silicon wafers, epitaxial Si layers, polysilicon layers, bonded wafers such as used in silicon-on-insulator (SOI) technologies, and/or amorphous silicon layers, all of which may be doped or undoped. If the substrate is undoped, it can then be doped with a first conductivity type dopant to the concentration noted above by any method known in the art.

Next, the backside contact region 55 is formed. In one embodiment of the present invention, the contact region 55 can be formed by a metallization process. Then, if the epitaxial layer 60 is not already present, it is formed on the substrate 10 by any process known in the art. If the epitaxial layer is not doped in situ, then the desired doping concentration can be formed using any known process. Next, the various dopant regions 35, 40, 45, 50, 65, and 70 can be formed as known in the art.

As depicted in FIG. 3, trench 85 is then formed in the upper surface of the epitaxial layer 60. The trench 85 can be are formed by any suitable masking and etching process known in the art. For example, the etching process can begin by forming a mask (not shown) with an opening(s) where the trench(es) will be formed. The silicon in the trench is then removed by etching through the mask. The parameters of the etching process are controlled to preferably form round bottom corners, smooth and continuous sidewalls, flat and clean trench bottom surfaces, and trench depth, thereby maintaining the integrity of the device characteristics using the trenches. After forming the trenches, the mask is removed by any suitable process known in the art.

As depicted in FIG. 4, the trench 85 is then filled with the material for insulating layer 80. This material for the insulating layer can be any high-quality insulating material known in the art, such as silicon nitride, silicon oxide, or silicon oxynitride. In one embodiment of the present invention, the insulating layer is silicon oxide (or "oxide"). In this embodiment of the present invention, an oxide layer is provided on the top surface of the epitaxial layer 60, including the trench 85. Any suitable method known in the art—including oxidation and deposition—yielding a high quality oxide layer can be used to provide this oxide layer. The portions of the oxide layer on the surface of the epitaxial layer 60 are then removed by any known process, leaving the oxide solely within the trench 85.

Next, a second trench 105 is formed within the insulating layer 80. This second trench can be formed in a manner substantially similar to the method used to form the first trench 85, with a few modifications. The first modification is that the mask material and the etching chemical may be different to account for the difference between etching silicon and etching the material for the insulating layer 80, e.g., oxide. The second modification is that the width of the mask openings for the second trench 105 will be smaller than the first trench 85.

After the second trench 105 is formed, the conductive material 110 for the gate, source, and drain is deposited to fill and overflow the remaining portions of the second trench 105 as illustrated in FIG. 5. This conductive layer can be suitable material that can be used as a gate conductor, such as a metal, metal alloy, or polysilicon. In one embodiment of the present invention, the conductive layer is heavily doped polysilicon. The conductive layer can be deposited using any known deposition process, including chemical vapor deposition process. Optionally, the conductive layer 105 can be doped with any suitable dopant to the desired concentration, particularly when the conductive layer is polysilicon or when a silicide can be used to reduce the resistance of the gate. Excess (and unneeded) portions of the conductive layer 105 are then removed using any conventional process to form the gate conductor 30, the source electrode 15, and the drain electrode 20. In another embodiment of the present invention, additional deposition, masking, and etching steps can be used if the conductive material for the gate conductor, the source electrode, and the drain electrode will be different.

After the above processes are concluded, conventional processing can continue to finish the MOSFET device. As well, other processing needed to complete other parts of the semiconductor device can then be carried out, as known in the art.

In the embodiment of the present invention described above and illustrated in the Figures, the first conductivity type is a p-type dopant and the second conductivity type is an n-type dopant. In another embodiment of the present invention, the device can be configured with the first conductivity type being a n-type dopant and the second conductivity type dopant being a p-type dopant.

Figure 6:
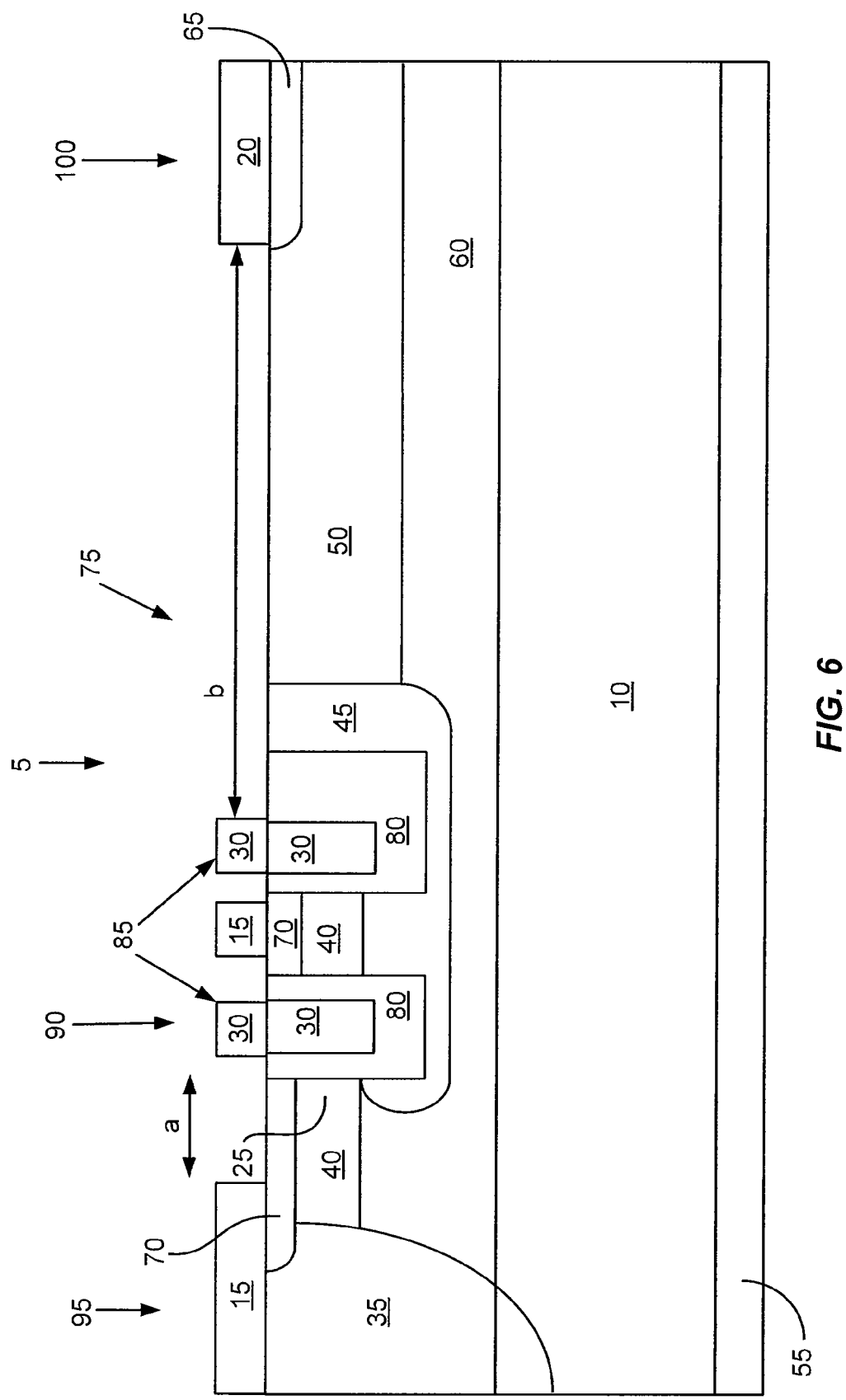
FIG. 6 illustrates a MOSFET device according to another embodiment of the present invention.
Figure 7:
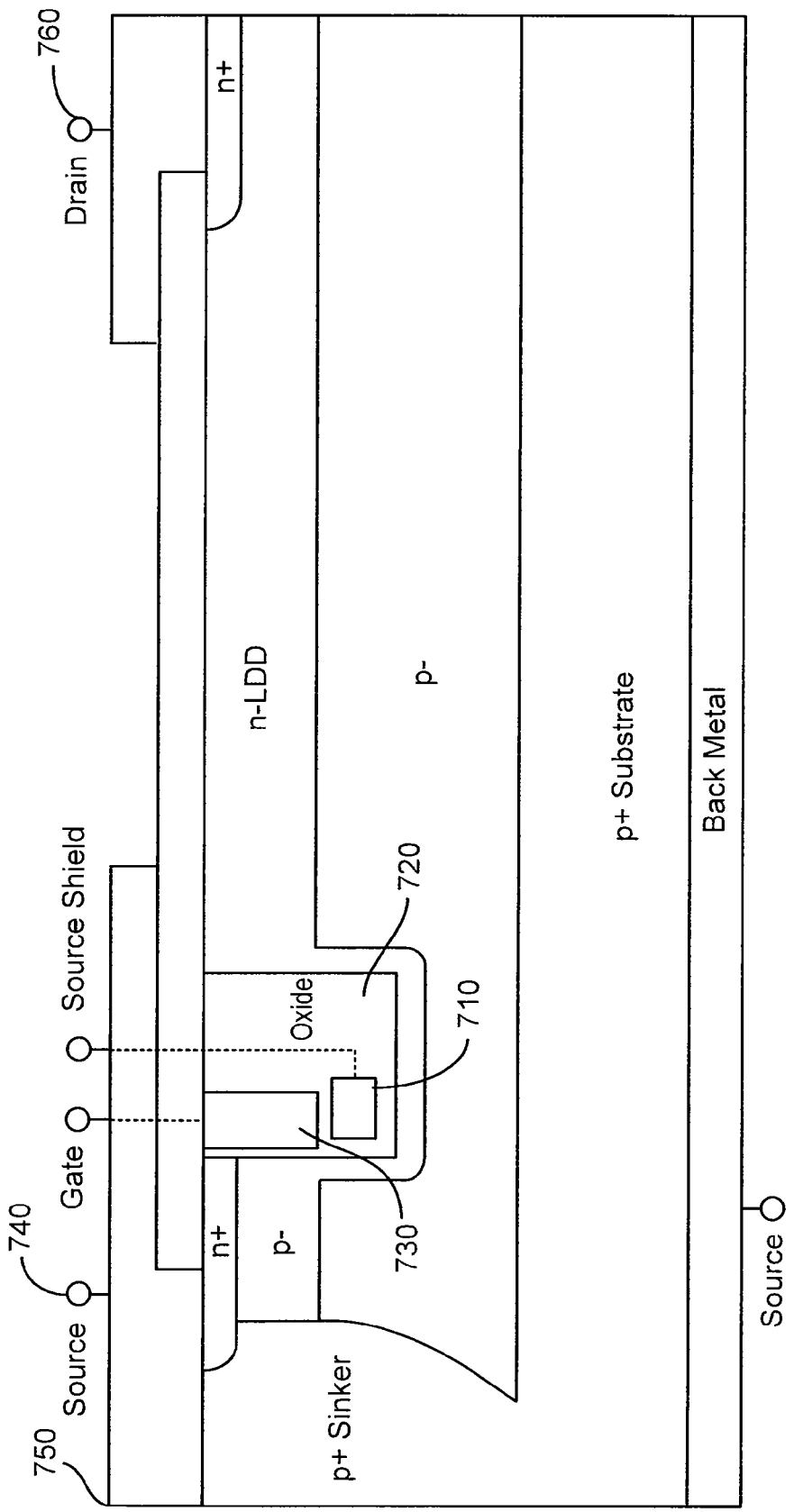
FIG. 7 shows a cross section view of a TG-LDMOS having a source shield integrated with the gate structure in accordance with an embodiment of the present invention.

The devices of the invention can also be modified to contain more than a single gate. For example, as depicted in FIG. 6, the devices of the invention can contain two trench gates between the source and drain. In the embodiment of the present invention shown in FIG. 6, the device can contain one gate with a symmetric oxide and one gate with an asymmetric oxide. In another embodiment of the present invention, both gates can contain an asymmetric oxide. The device in FIG. 6 is manufactured similar to the device depicted in FIG. 2, except that two trenches with two gate structures could be provided instead of a single trench. Other modifications are described below:

FIG. 7 shows a cross section view of a TG-LDMOS having a source shield 710 integrated with the gate structure 720 in accordance with an embodiment of the invention. The source shield is located below the gate 730 and is electrically connected (not shown) to the source terminal 740. In one embodiment, the connection to the source terminal 740 is made by extending the source shield 710 in the direction perpendicular to the page and then routing it up to the trench surface where electrical contact is made to the source metal 750. Such devices can be used in RF applications and in high power switching applications. As shown, the TG-LDMOS has a vertical channel but employs a lateral drift region which together with an n-type region wrapping around a bottom portion of the trench forms a contiguous n-type region. The trench has a thick insulator along its bottom and an asymmetrical insulator along its sidewalls (i.e., has a thicker insulator along its drain-side sidewall than its source-side sidewall) to reduce parasitic capacitance.

The source shield 710 improves device high frequency gain by reducing the gate-to-drain capacitance (Cgd) and improves the breakdown voltage characteristics. While in operation, the electric field resulting from the biased gate 730 is terminated in the shield plate (source-shield 710) thus minimizing Cgd. There is a slight increase in input or Ciss capacitance due to the presence of the source shield 710 but this can be compensated by input impedance matching. Accordingly, by providing a "shield" between the gate 730 and the drain 760, Cgd is significantly reduced thus increasing the maximum oscillation frequency. Moreover, the source shield 710 helps reduce the hot carrier effects by reducing the peak electric field and impact ionization The process technology for forming the source-shield TG-LDMOS in FIG. 7 is compatible with conventional silicon MOSFET technology. In one embodiment, the process steps described below and illustrated in FIGS. 8A-8D is used to make the source-shield TG-LDMOS in FIG. 7.

Figure 8A:
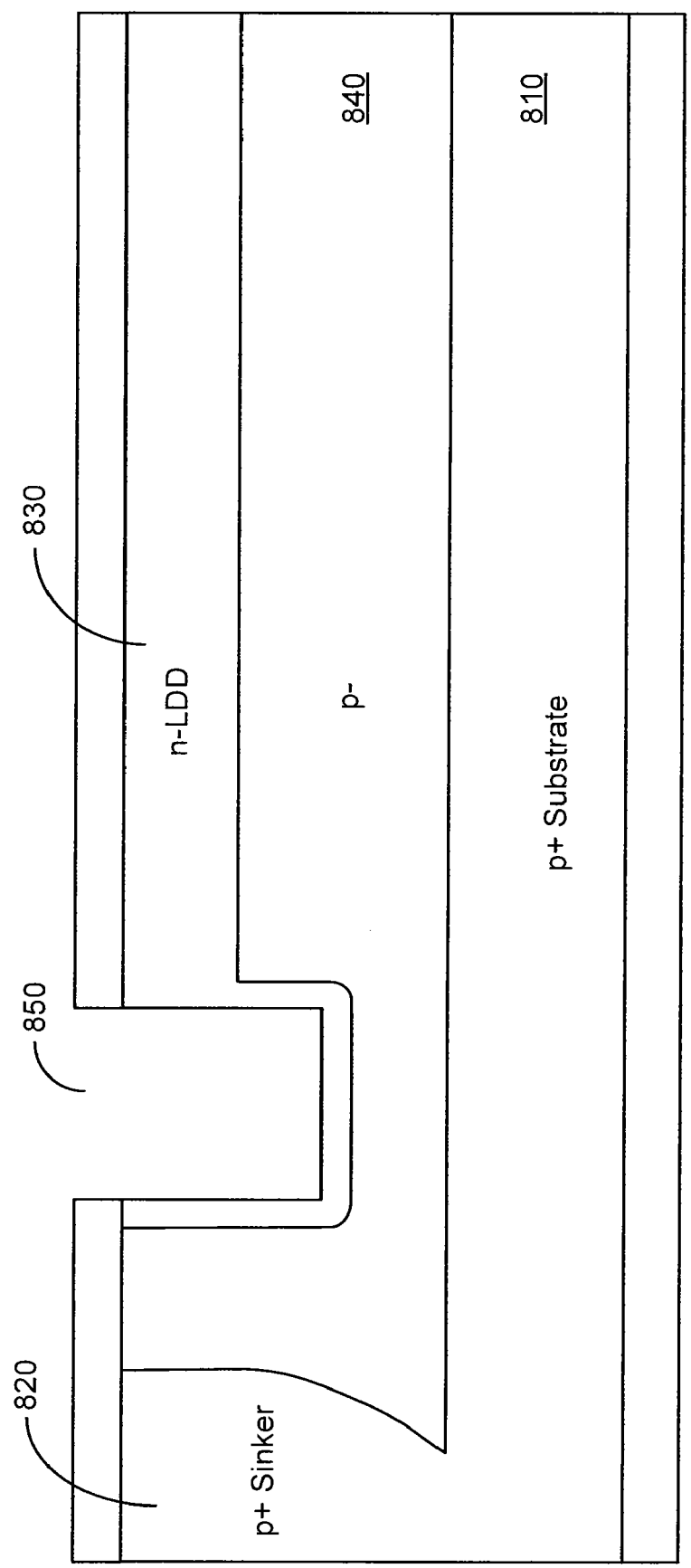
FIGS. 8A-8D depict an exemplary sequence of process steps for manufacturing the source-shield TG-LDMOS in FIG. 7 in accordance with one embodiment of the present invention.

A silicon substrate such as silicon wafers or epitaxial silicon layers may be used. If the substrate is undoped, it can then be doped with a first conductivity type dopant to a desired concentration by any method known in the art. In one embodiment, highly doped silicon wafer is used to reduce source resistance in the substrate. In FIG. 8A, a p+ type substrate 810 is used. If an epitaxial layer is not already present, it is formed on the substrate using conventional methods. If the epitaxial layer is not doped in situ, then the desired doping concentration may be obtained using conventional methods. As shown in FIG. 8A, the various dopant regions such as the p+ type sinker 820 and n− type LDD region 830 are formed as known in the art. For example, conventional sinker mask implant and drive-in steps and LDD mask implant and drive-in steps may be carried out to form the p+ type sinker 820 and n− type LDD regions 830, respectively. Other dopant regions such as the p− type body region (not shown) and n+ contact regions (not shown) may also be formed at this stage even though they are shown being formed in later stages.

A trench 850 is then formed in the upper surface of the epitaxial layer using conventional masking and etching steps. For example, the etching process can begin by forming an oxide hard mask with an opening where the trench 850 is to be formed. The silicon in the trench area 850 is then removed by etching through the mask opening. The parameters of the etching process are controlled to preferably form rounded corners and smooth and clean trench sidewalls and bottom surfaces, thereby maintaining the integrity of the device characteristics. In one embodiment, after the trench surfaces are cleaned, the portion of the LDD region 830 which wraps abound the trench is formed by carrying out a conventional implant (e.g., angled implant) or plasma immersion doping or equivalent, followed by activation. The oxide hard mask may be then be removed or left in place for subsequent processing.

Figure 8B:
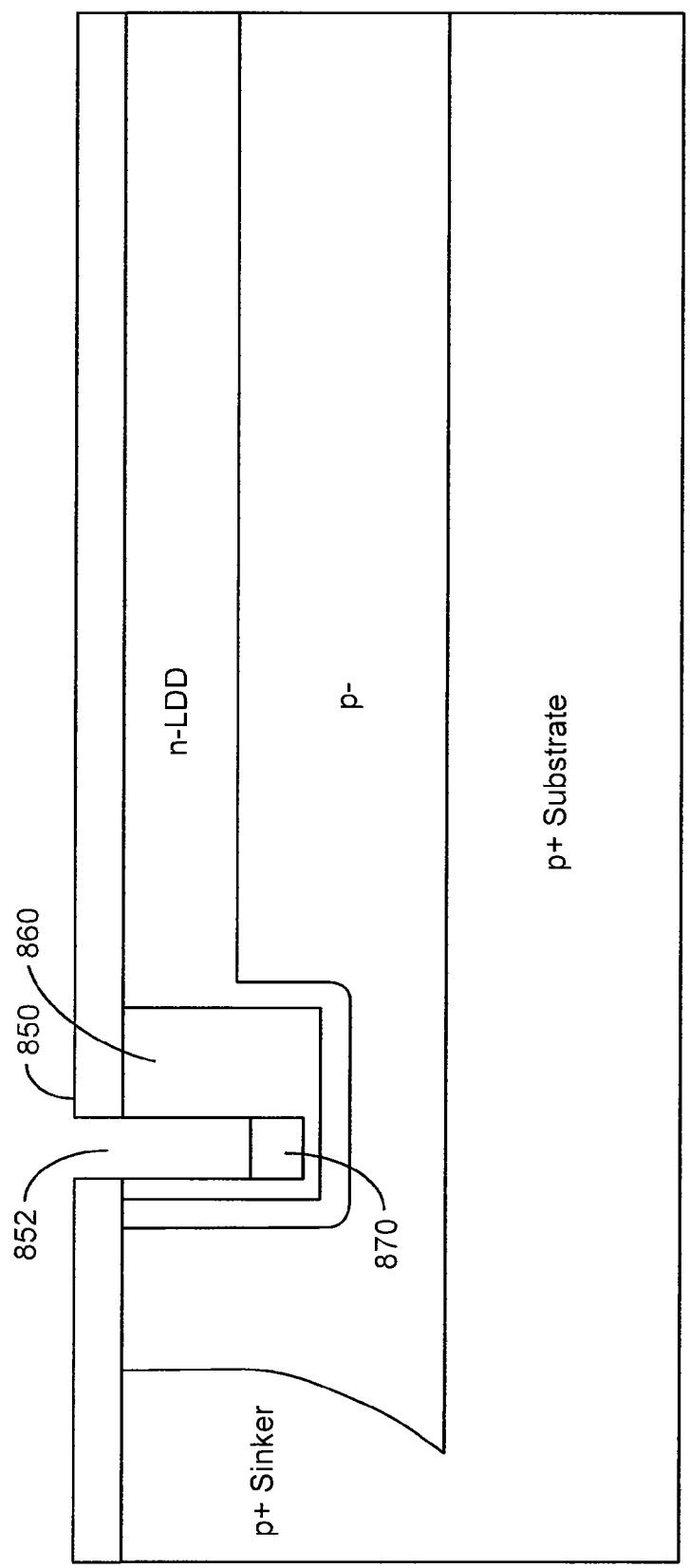

In FIG. 8B, the trench 850 is then filled with insulating material 860. The insulating material can be any high-quality insulating material known in the art, such as silicon nitride, silicon dioxide, or silicon oxynitride. In the embodiment shown in FIG. 8B, the insulating layer is silicon dioxide (or "oxide") which is formed on the top surface of the epitaxial layer and in the trench. Any suitable method known in the art—including oxidation and deposition—yielding a high quality oxide layer can be used to form this oxide layer. The portions of the oxide layer on the surface of the epitaxial layer are then removed using conventional methods (e.g., CMP or etch techniques), thus leaving the oxide solely within the trench.

Using a mask (shown in FIG. 8B as the top layer), a trench 852 is then formed within and on the source-side of the oxide-filled trench. In one embodiment, the trench 852 is formed in the oxide by etching the oxide through the mask opening. Such etching step would need to be selective to oxide over silicon to prevent etching of the silicon along the left sidewall (source side) if the mask opening overlaps the left edge of the trench due to for example misalignment. A thermal oxide could then be formed on the exposed silicon sidewall. A conductive material is deposited to fill the trench and then recessed into the oxide trench to form the "shield electrode" 870. This conductive material may, for example, be from the same material as the gate conductor, such as a metal, metal alloy, or polysilicon.

Figure 8C:
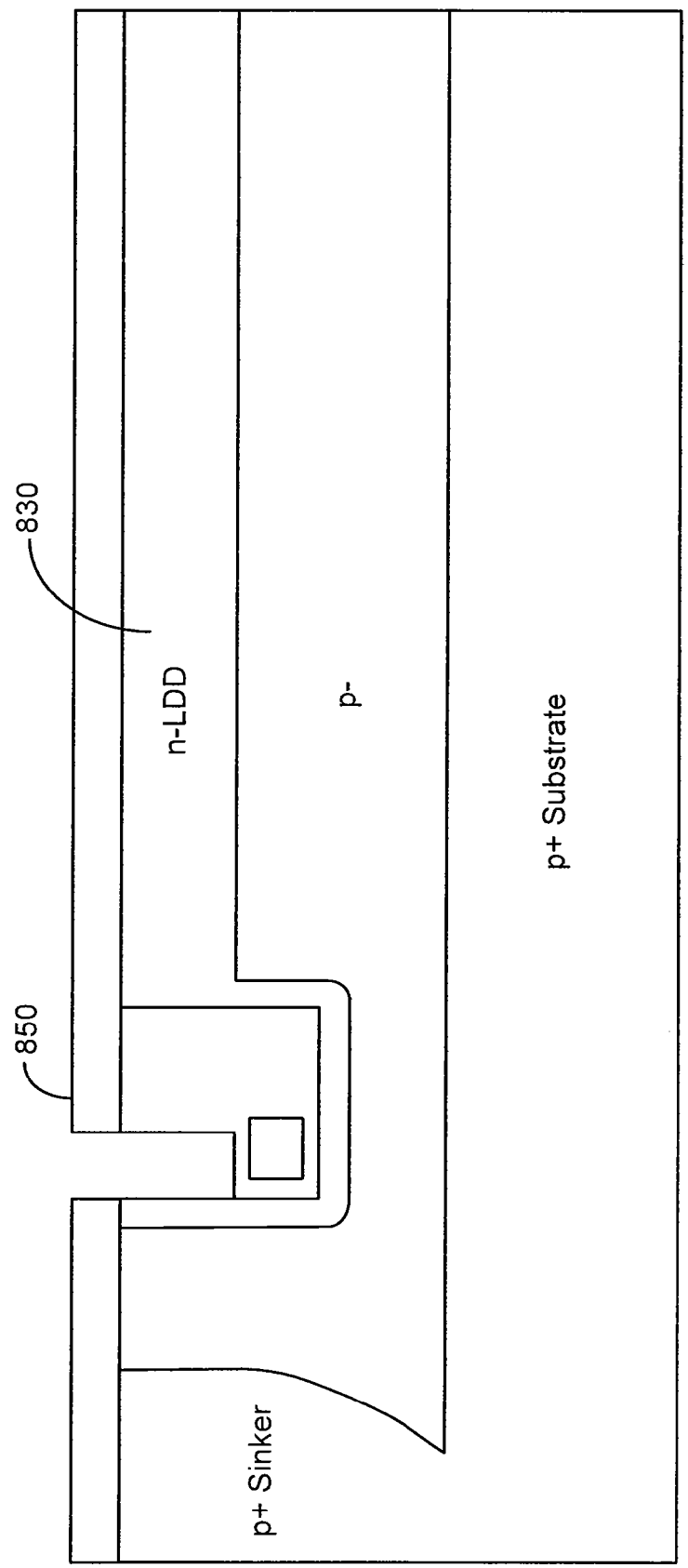

In FIG. 8C, conventional oxidation and etch steps are carried out to refill the oxide trench 850. Using a mask (shown in FIG. 8C as the top layer), the oxide above and to the left of the shield electrode is partially removed so that a layer of oxide remains over the shield electrode and the n− type LDD 830 along the left sidewall (i.e., source-side) of the trench becomes exposed, as shown. In an alternate embodiment, a selective deposition technique is used to form the oxide layer over the shield electrode.

Figure 8D:
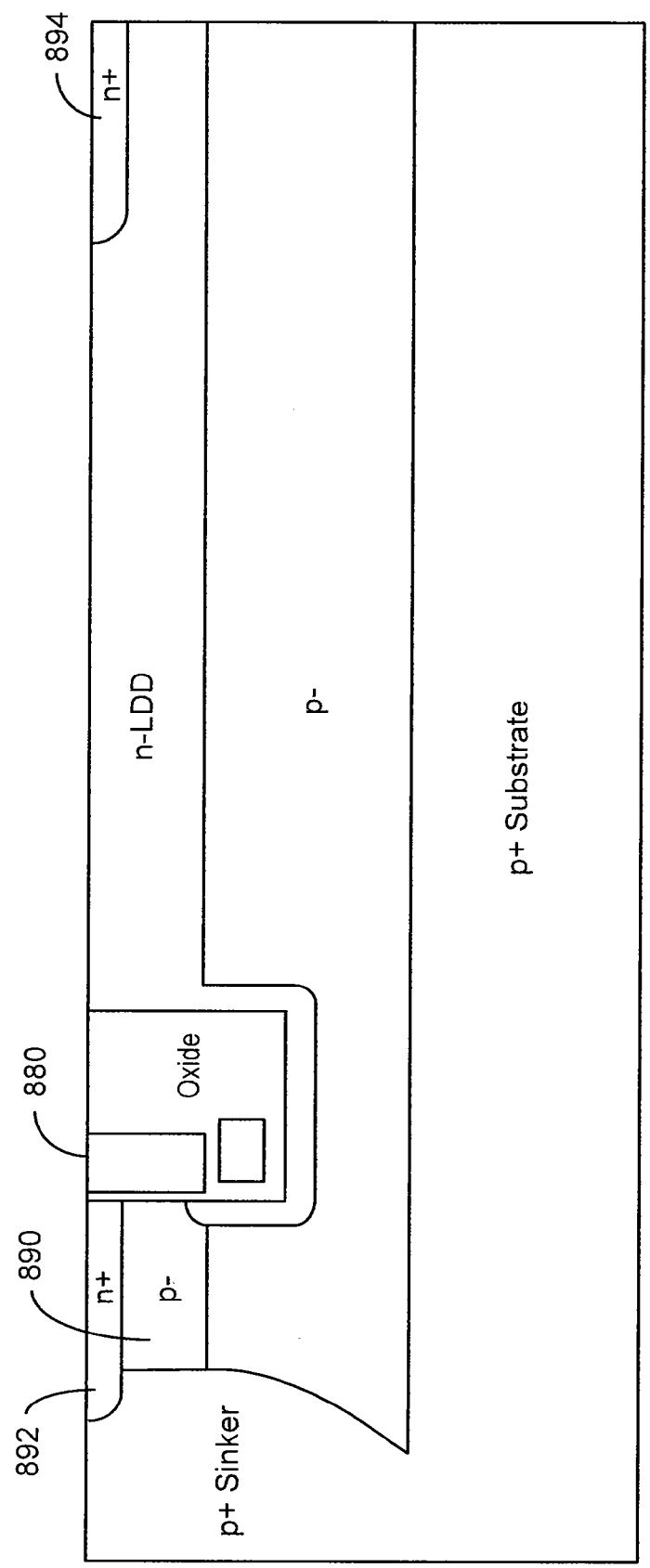

In FIG. 8D, a gate oxide layer 880 is formed along the exposed silicon sidewall of the trench using conventional methods. A suitable conductive material (e.g., polysilicon) is then deposited and etched back to from the gate electrode. Using a mask, implant and drive-in steps are performed to form the p− type body region 890, as is known in the art. Using source/drain mask, conventional implant and activation steps are performed to form the n+ type source 892 and drain 894 regions. The final structure shown in FIG. 7 is obtained upon forming dielectric and metal layers (not shown), including the back metal, using conventional methods.

Figure 9A:
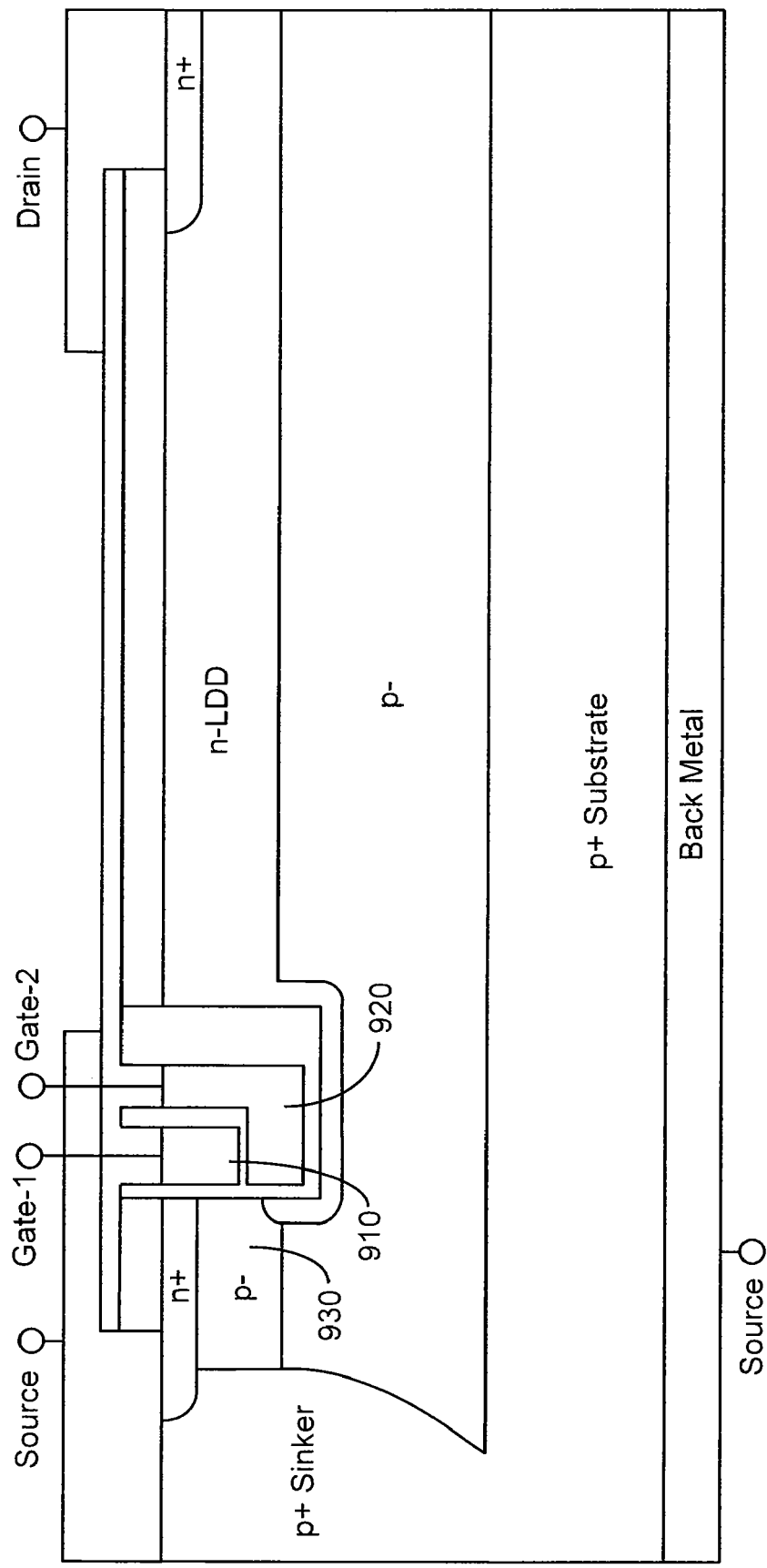
FIGS. 9A and 9B respectively show a cross section view of a TG-LDMOS having two control gates and a corresponding transistor symbol in accordance with another embodiment of the present invention.

FIG. 9A shows a cross section view of a TG-LDMOS having two control gates 910 and 920 in accordance with another embodiment of the invention. A trench structure having dual-gates is disclosed in the above-referenced patent application entitled "Improved MOS Gating Method for Reduced Miller Capacitance and Switching Losses". However, the dual-gate structure in the above-referenced application is not implemented in a TG-LDMOS structure and is different from the FIG. 9A structure in many respects.

Figure 9B:
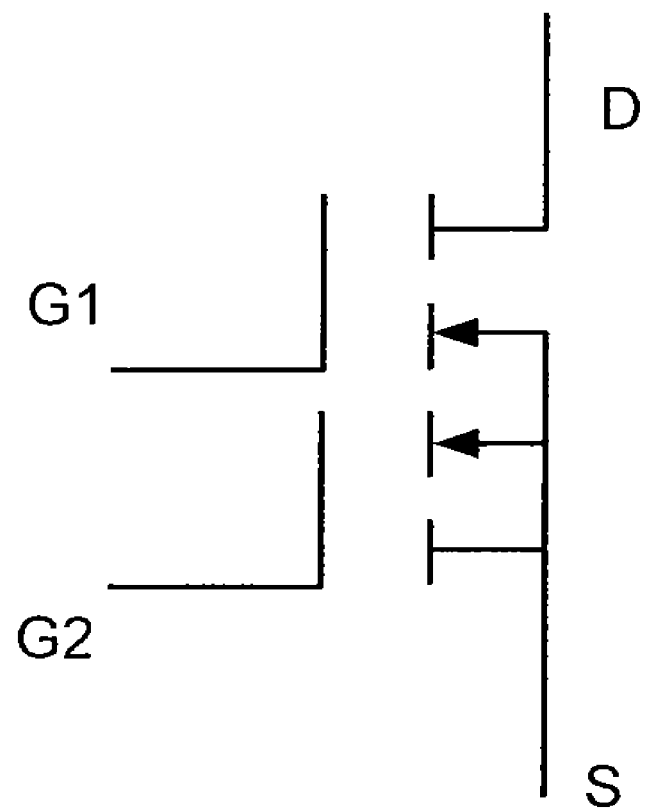

In FIG. 9A, both control gates (Gate-1 910 and Gate-2 920) overlap the channel region 930, and thus both control gates need to be properly biased to turn on the MOSFET. The top gate (Gate-1) 910 modulates the current flow when the bottom gate (Gate-2) 920 is biased appropriately. The bottom gate 920 can be continuously biased or only biased prior to a switching event. FIG. 9B shows a transistor symbol of the dual gate TG-LDMOS. The dual-gate technique in FIG. 9A helps reduce the device gate-to-drain capacitance (Cgd) to extremely low levels which in turn reduces switching losses of any MOS-gated device. Thus, the switching efficiency is improved allowing operation at higher frequencies. The dual-gate structure is particularly suitable for use in such applications as high voltage RF devices or other high frequency switching MOSFETs. In RF MOSFET devices, the lower Cgd is highly desirable because it increases RF gain and minimizes signal distortion. Also, Gate-2 920 acts much like the shield element 710 in FIG. 7 to shield the dynamic Gate-1 910 although it is biased differently than that in FIG. 7.

The process technology for forming the dual-gate TG-LDMOS in FIG. 9A is compatible with conventional silicon MOSFET technology. In one embodiment, process steps similar to those depicted in FIGS. 8A-8D with some modifications in connection with forming the lower gate, which would be known to one skilled in the art, may be used. An alternate set of process steps described below and illustrated in FIGS. 10A-10D may also be used to make the dual-gate TG-LDMOS in FIG. 9A.

Process steps depicted in FIGS. 10A-10D are similar to those described above for TG-LDMOS structure in FIG. 7 except for adjustments in the vertical positions and few other differences. The particular sequence of steps described herein is not intended to be limiting, and may be modified in ways known to one skilled in this art for optimum results.

Figure 10A:
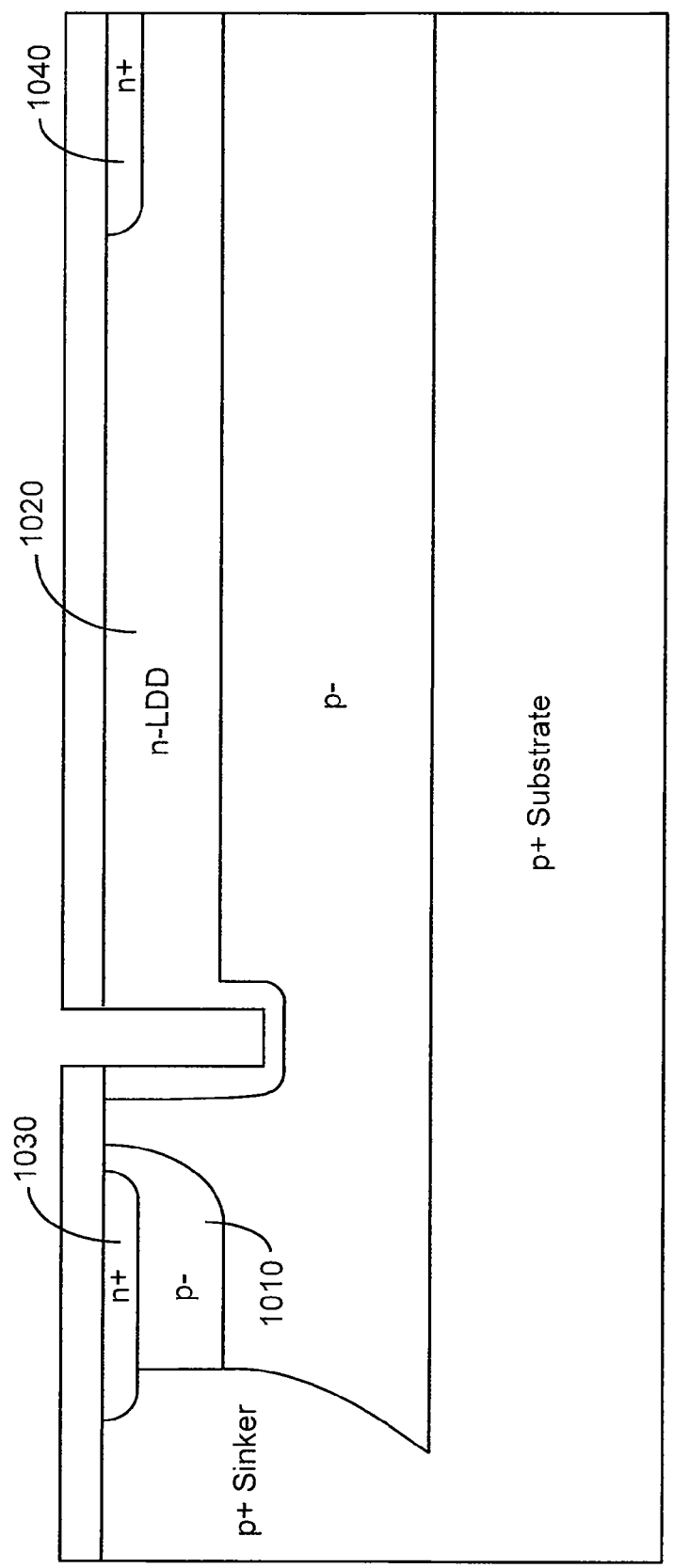
FIGS. 10A-10D depict an exemplary sequence of process steps for manufacturing the dual-gate TG-LDMOS in FIG. 9A in accordance with one embodiment of the present invention.

In FIG. 10A, p− type body region 1010, n− type LDD 1020, and n+ type source 1030 and drain 1040 regions are formed using conventional mask, implant, and drive-in steps. A first trench and the portion of the LDD region wrapping around the trench are formed in a manner similar to that in FIG. 8A.

Figure 10B:
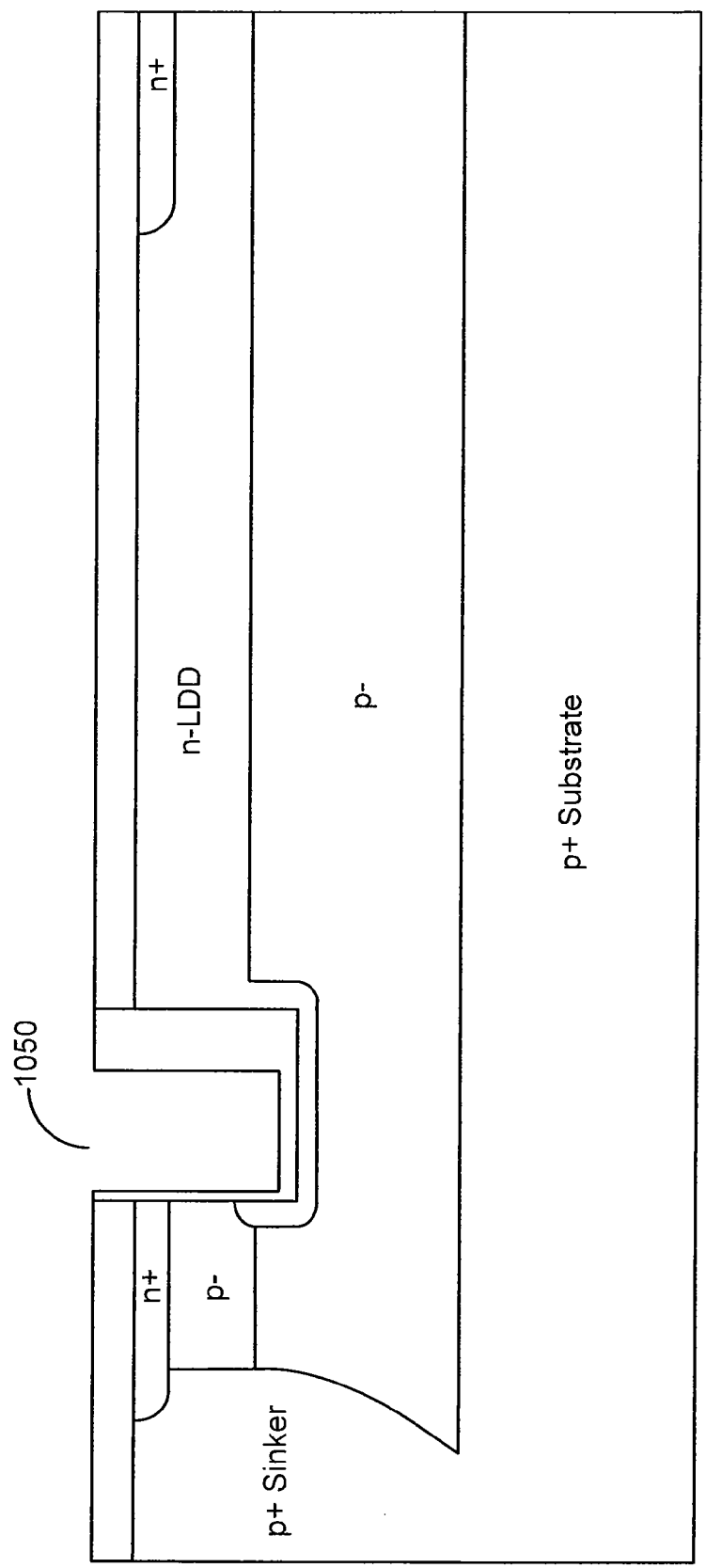

In FIG. 10B, after filling the first trench with a dielectric material (e.g., oxide) and etching back to the planar surface, a second trench 1050 is formed in the silicon next to the dielectric-filled trench. This new trench can be etched conventionally into silicon and is provided with a thick oxide on the bottom and gate oxide on the sidewall. This can be accomplished using selective oxide deposition, or a LOCOS technique as disclosed in U.S. Pat. Nos. 6,437,386, 6,368,920, and 6,444,528, relevant portions of which are incorporated herein by reference. If the depth of the trench does not extend much below the LDD or body region, then an implant into the trench bottom would suffice to bridge the drain LDD structure to the trench sidewall where the channel will be formed. A threshold adjustment implant into the left (source side) sidewall of the trench may be carried out using an angled implant. This step might be necessary depending on the trench bottom LDD process.

Figure 10C:
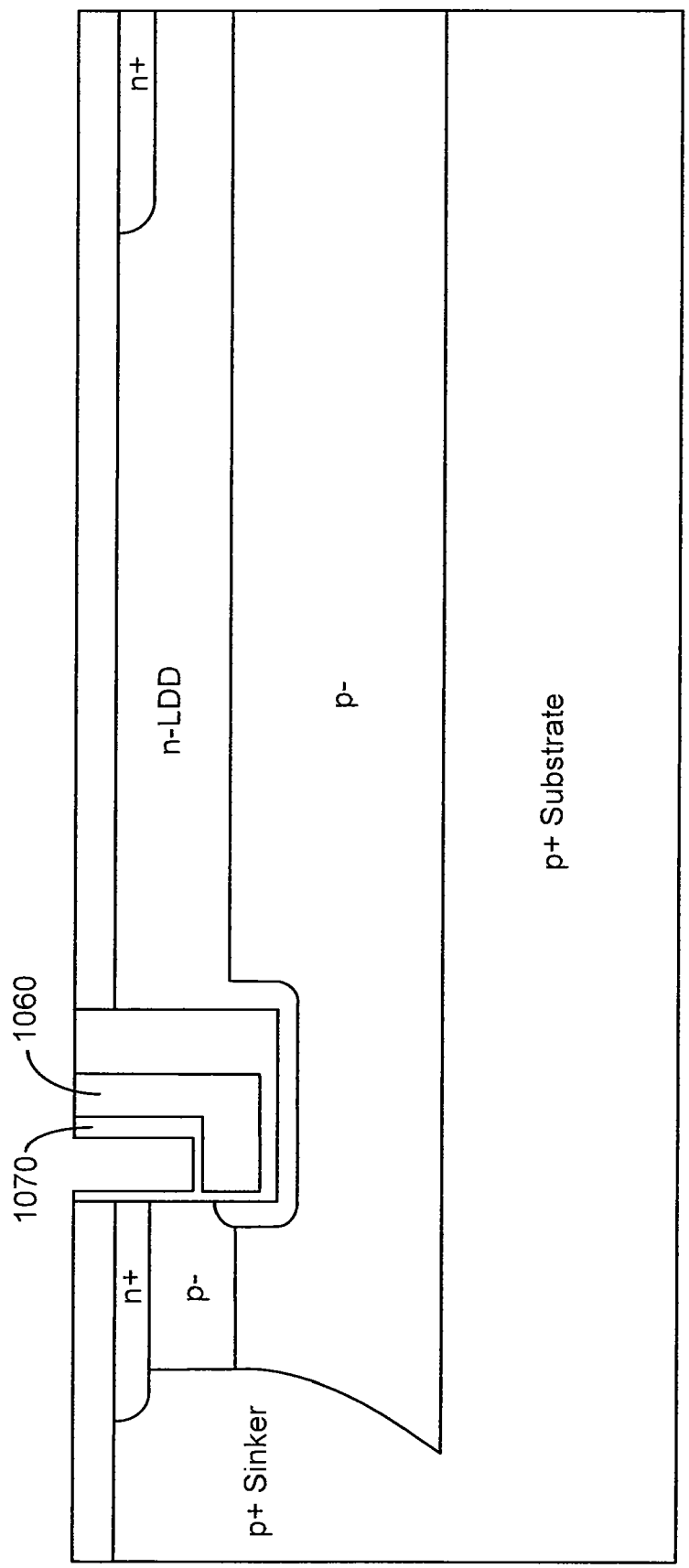

In FIG. 10C, a conformal polysilicon layer 1060 is deposited lining the trench. A dielectric 1070 is deposited and planarized to fill the polysilicon-lined trench. The polysilicon is etched back to the plane surface. Using a mask (not shown), the polysilicon is recessed by etching to reach the top of the polysilicon lining the bottom of the trench. The original gate oxide can be removed and a new oxide layer grown. The dielectric layer at the bottom of the top gate (gate-1) will be relatively thin and this can be increased with additional oxide depositions and planarization prior to gate-1 polysilicon.

Figure 10D:
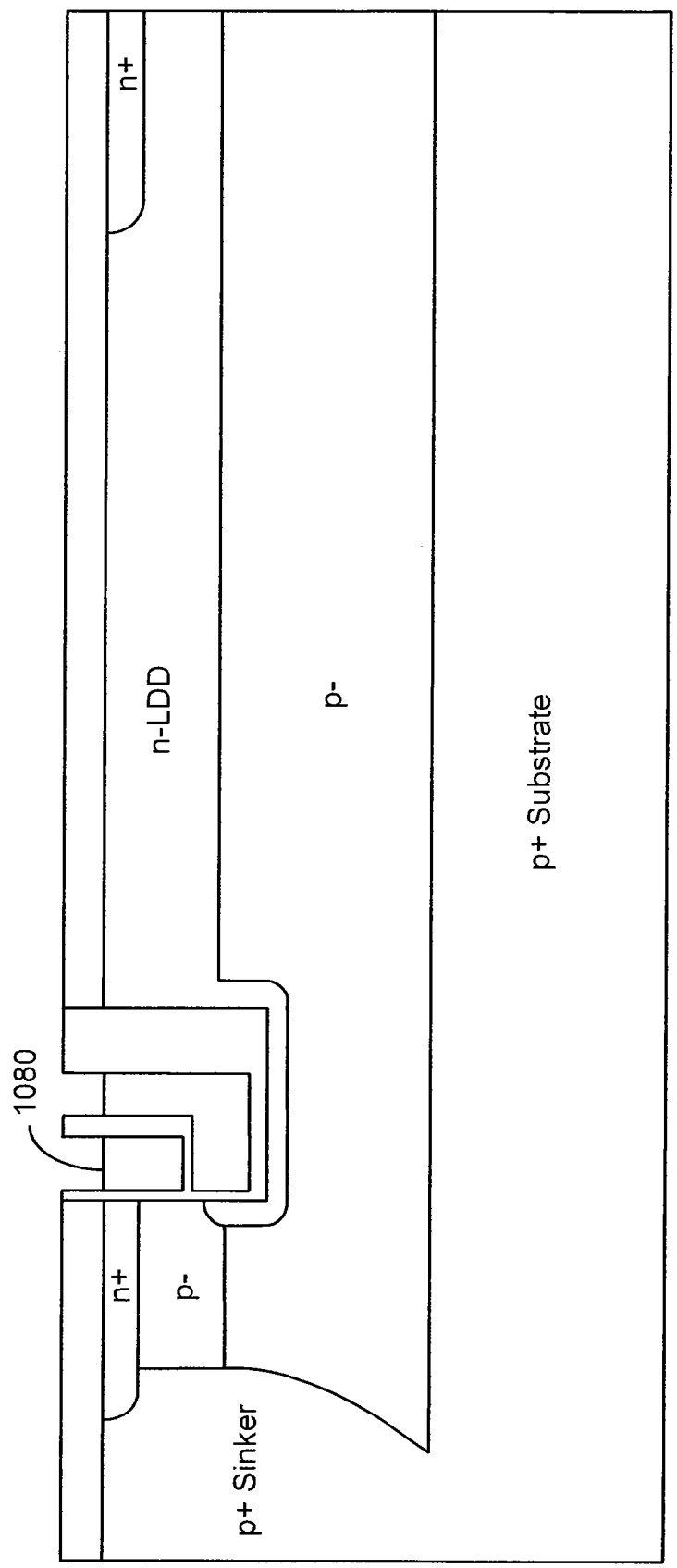

In FIG. 10D, Gate-1 polysilicon 1080 is deposited and planarized. The polysilicon for both gates can be recessed to reduce capacitance. The remaining dielectric and metal layers, including back metal, can be added by conventional means to achieve the structure depicted in FIG. 9A.

Figure 11A:
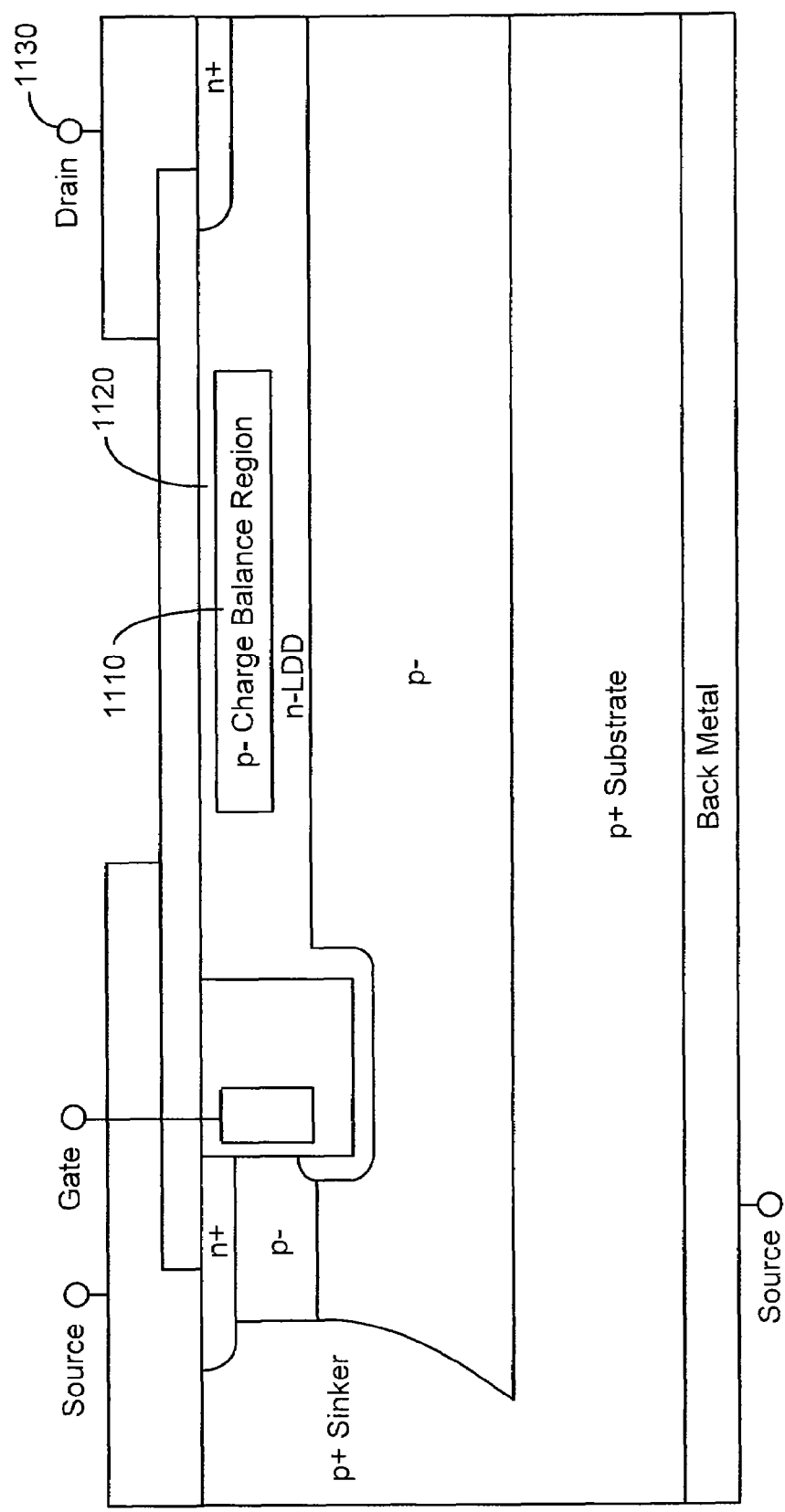
FIGS. 11A and 11B show cross section views of two TG-LDMOS structures wherein a charge-balancing technique is used to improve the breakdown voltage in accordance with another embodiment of the present invention.
Figure 11B:
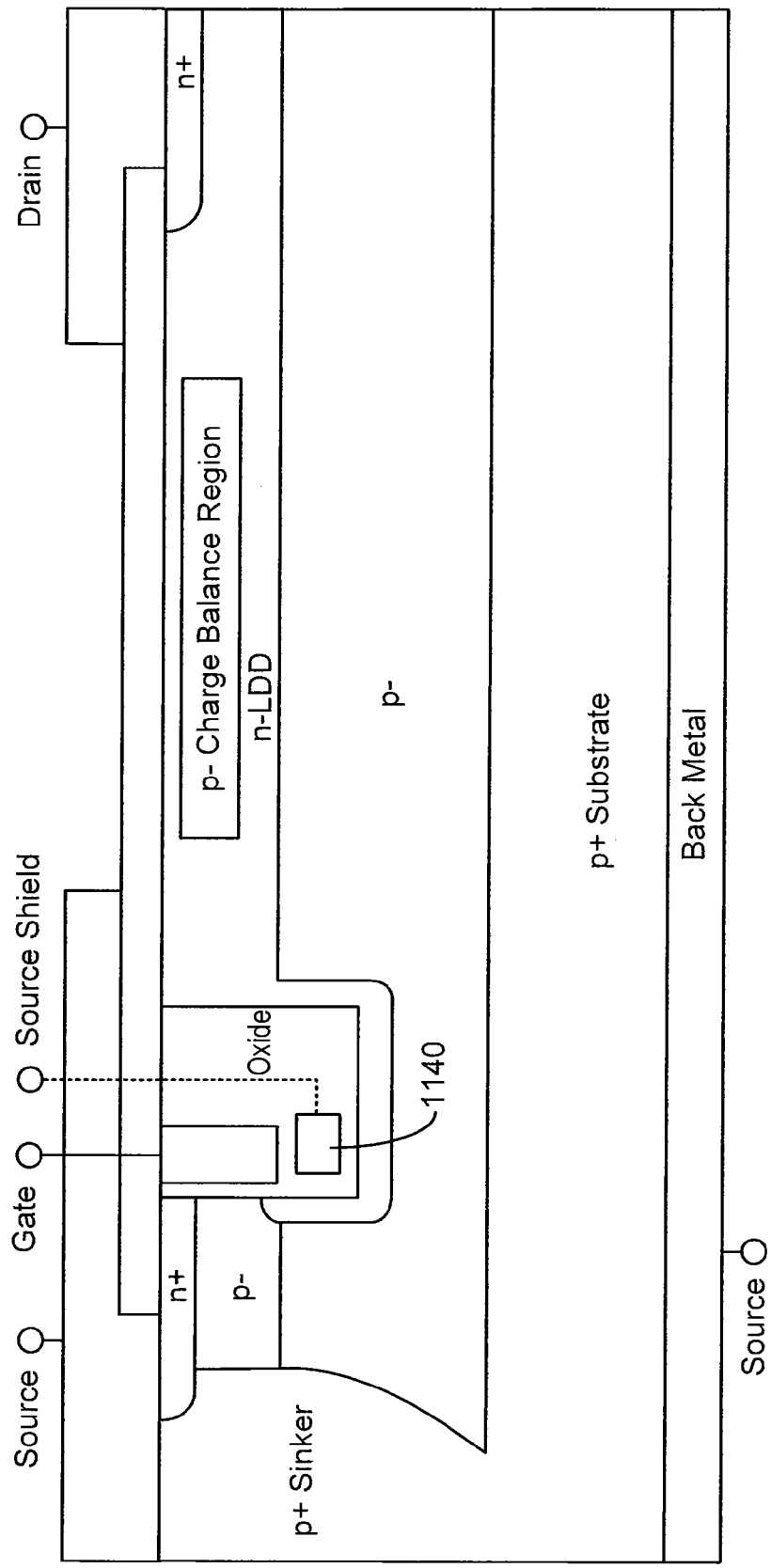

FIGS. 11A and 11B show cross section views of two TG-LDMOS structures wherein a charge-balancing technique is used to improve the breakdown voltage in accordance with another embodiment of the invention. As shown in FIG. 11A, a p– type region 1110 extends laterally in the n– type LDD drift region 1120 between the trench and the drain. The laterally extending p– type region 1110 may have a fixed or graded doping concentration. The laterally-extending p– type region results in a more uniform electric field in the LDD drift region thus improving the device breakdown voltage.

In alternate embodiments, the charge balance structure 1110 can be configured in parallel stripes and can be either floating or electrically connected to the drain terminal 1130. They can also be positioned on the surface (the easiest embodiment to manufacture). Alternatively, floating charge balance junctions can be arranged as islands dispersed within the body of the LDD region. The charge balance structures allow the LDD structure 1120 to have higher doping concentration and thus lower resistance. These charge balance techniques can be integrated with the source shield structure 1140 as shown in FIG. 11B, with a dual gate structure, or with other TG-LDMOS structures to improve the breakdown voltage.

Figure 12A:
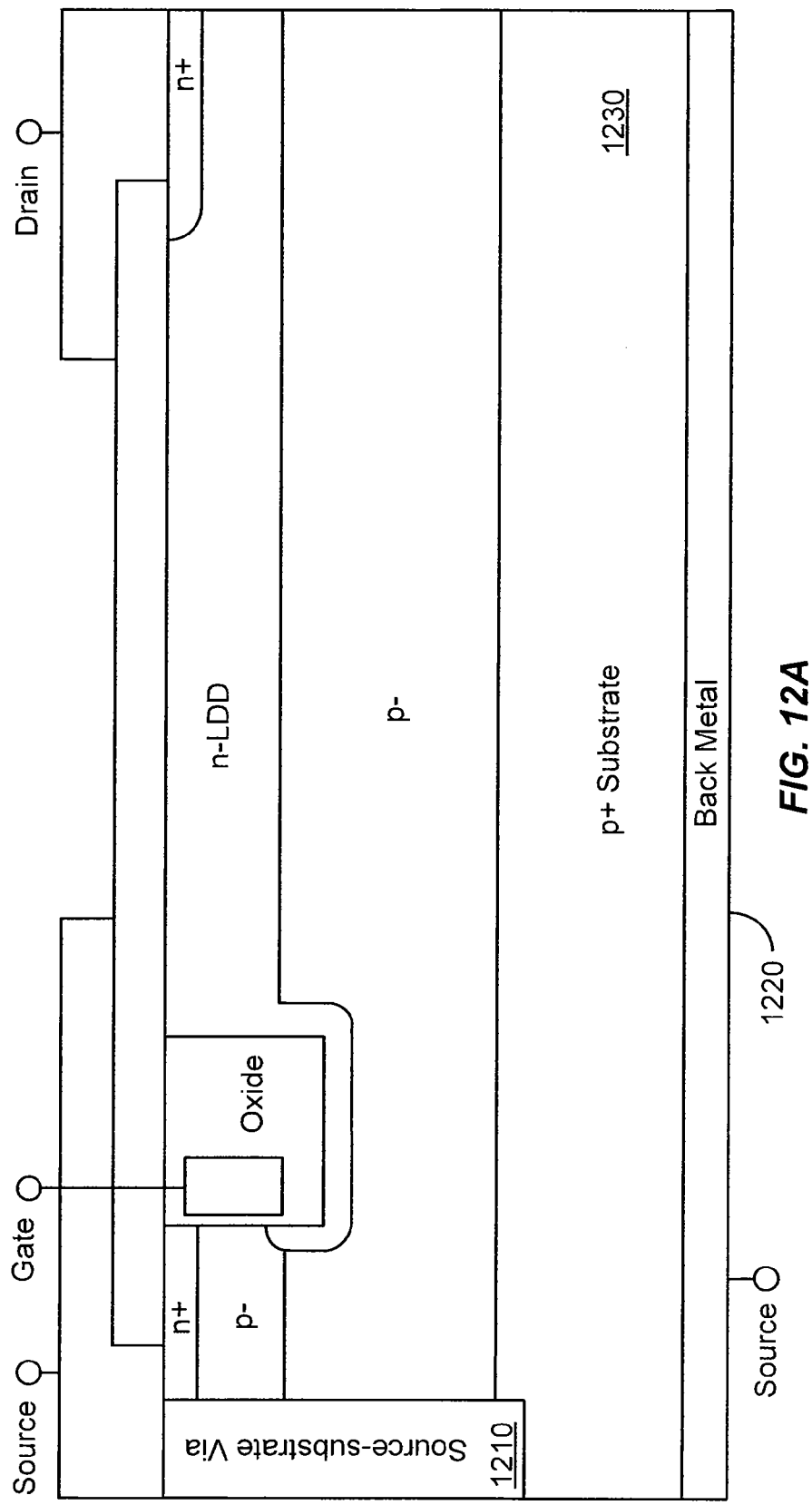
FIGS. 12A and 12B respectively show a cross section view of TG-LDMOS structure having a source-substrate via and a variation thereof in accordance with an embodiment of the present invention.
Figure 13A:
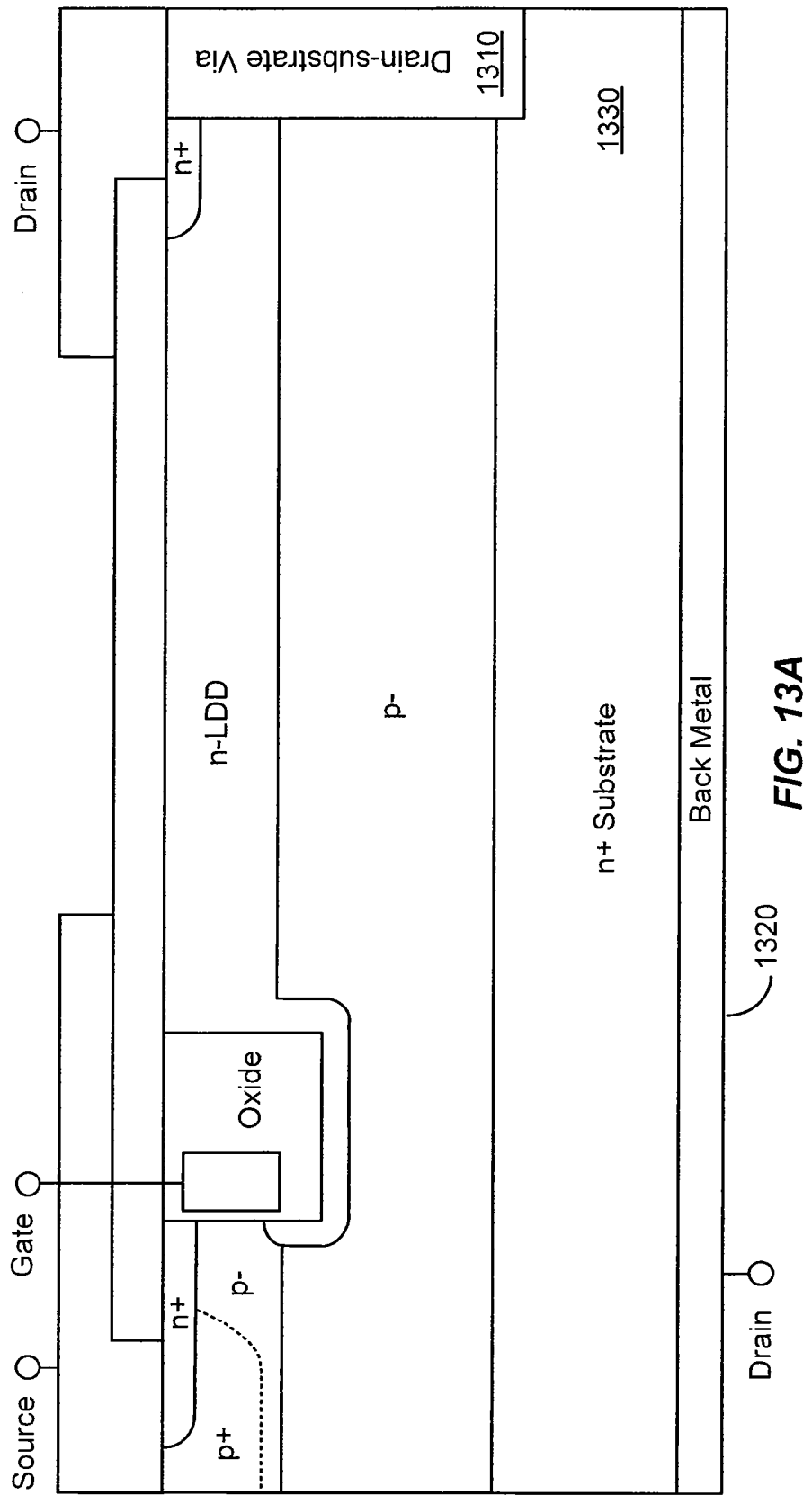
FIGS. 13A-13C respectively show a cross section view of TG-LDMOS structure having a drain-substrate via and a variation thereof in accordance with an embodiment of the present invention.

FIGS. 12A and 13A show cross section views of TG-LDMOS structures having a source-substrate via 1210 and drain-substrate via 1310, respectively, in accordance with other embodiments of the invention. The two via structures are substantially similar except that in the source-substrate via structure 1210, the back side 1220 is a source coupled to a p+ substrate 1230, and in the drain-substrate via structure 1310, the back side 1320 is a drain coupled to a n+ substrate 1330. The source-substrate via 1210 and drain-substrate via 1310 are used to reduce the source and drain resistance by replacing the relatively high resistance p+ sinker used for connection to the substrate with a trench filled with highly conductive material such as tungsten or in situ doped polysilicon. They also allow the surface area consumed by the substrate connection to be reduced.

Further, the source-to-substrate 1210 and drain-to-substrate 1310 connections allow monolithic integration of the TG-LDMOS with other components such as additional DMOS for High Side/Low Side monolithic integrated half bridge. They also can be used for chip scale packaging (CSP) where it is desirable to bump a driver onto the TG-LDMOS.

Figure 12B:
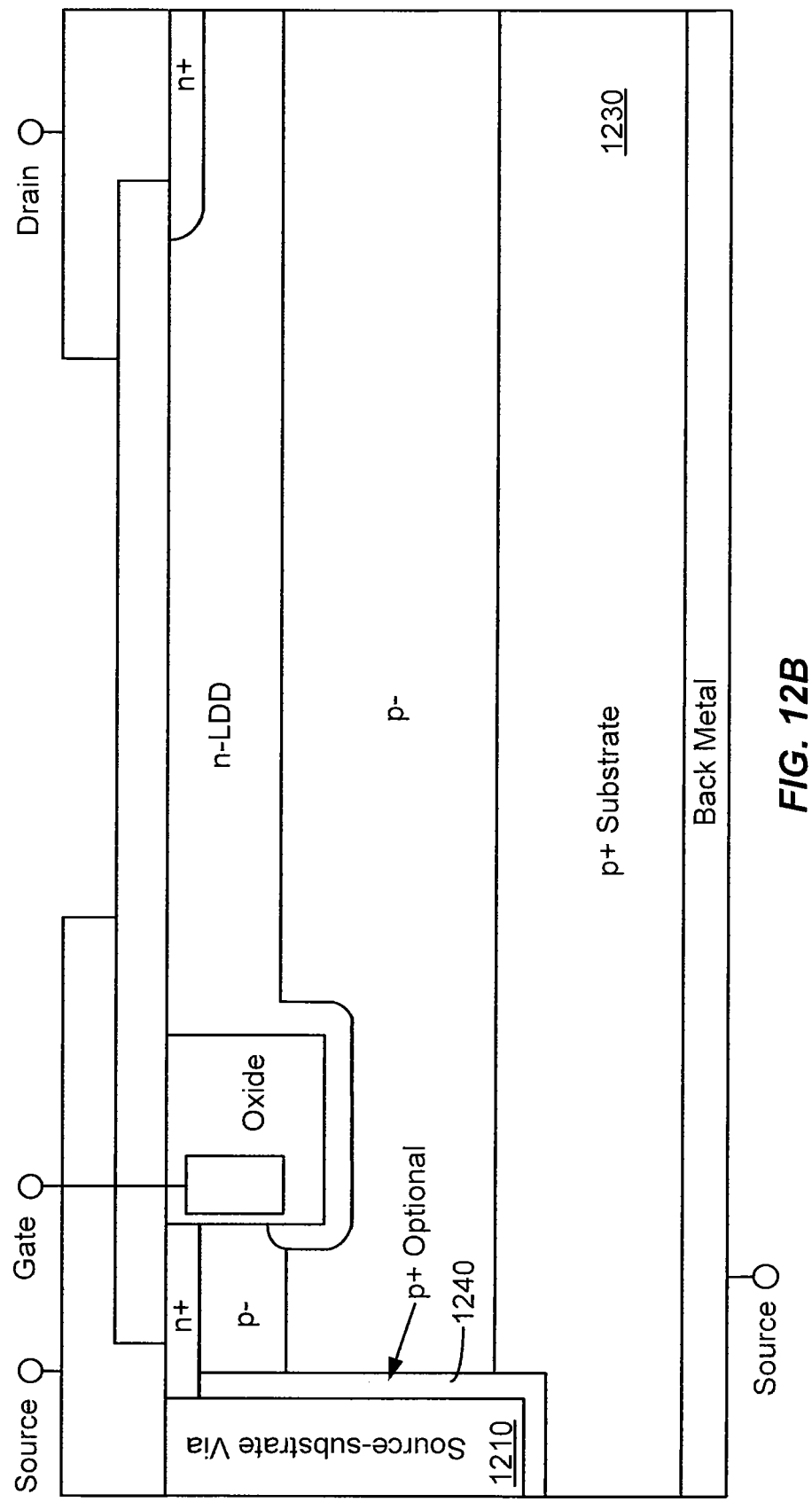
Figure 13B:
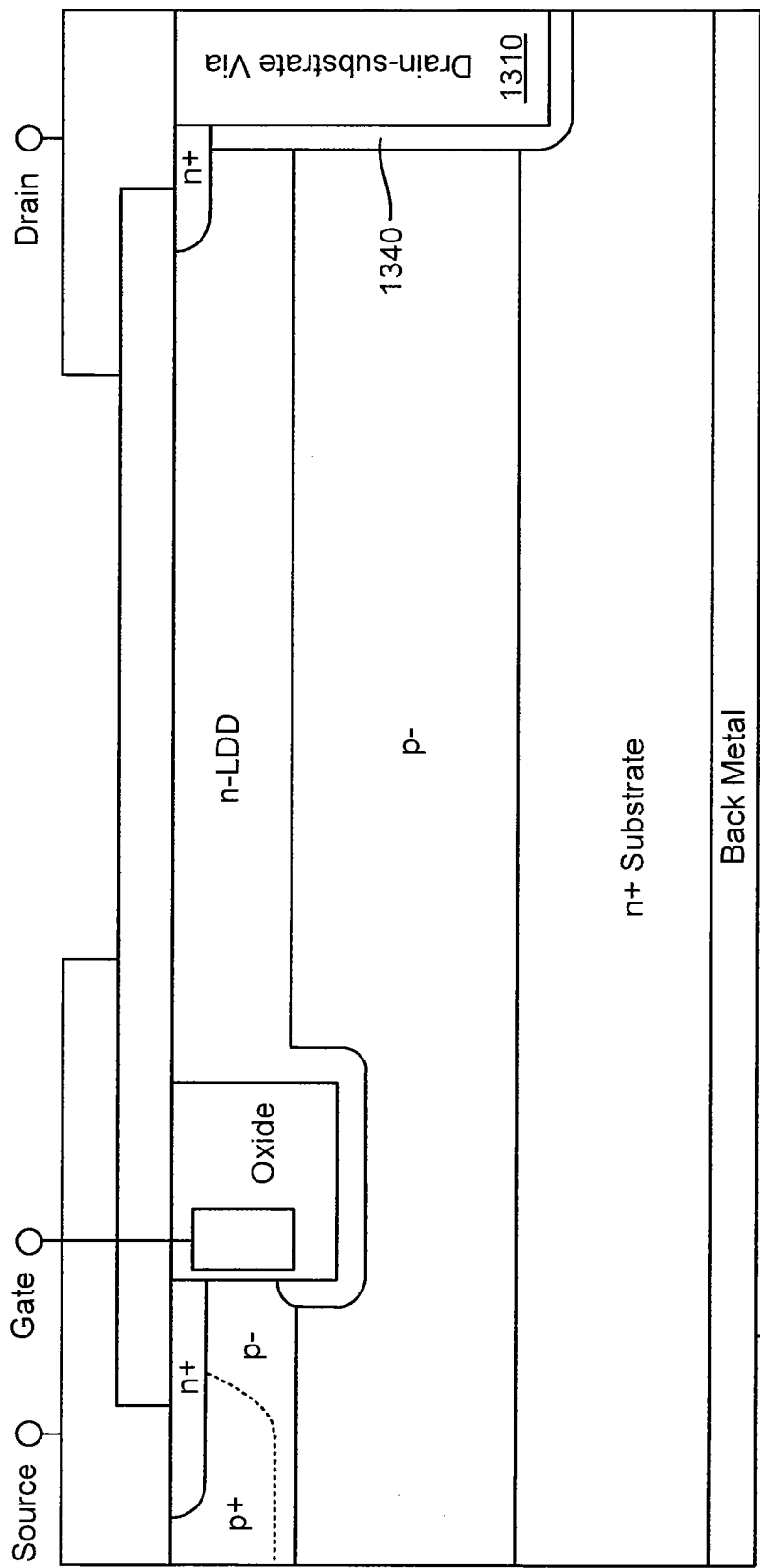

FIGS. 12B and 13B show alternate embodiments wherein the connection to the substrate is further facilitated by a p+ layer 1240 formed around the source-substrate via 1210 and a n+ layer 1340 formed around the drain-substrate via 1310, respectively. The highly doped p+ 1240 and n+ 1340 layers may be formed by implanting dopants into the trench sidewall. In an alternate embodiment, an oxide-lined polysilicon-filled trench is used for simplicity.

Figure 12C:
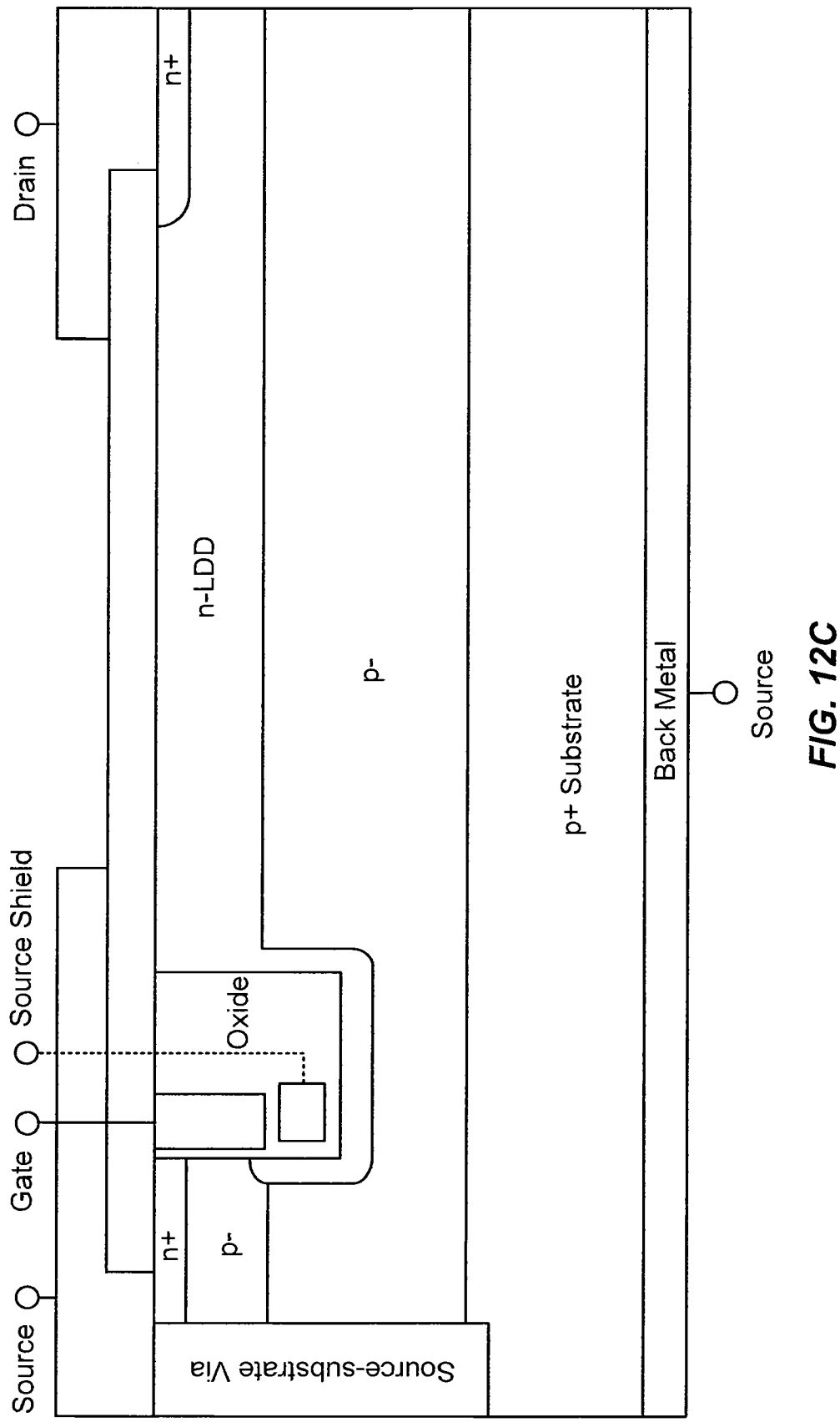
FIG. 12C shows integration of the source-substrate via of FIG. 12A with the source shield TG-LDMOS structure of FIG. 7.
Figure 13C:
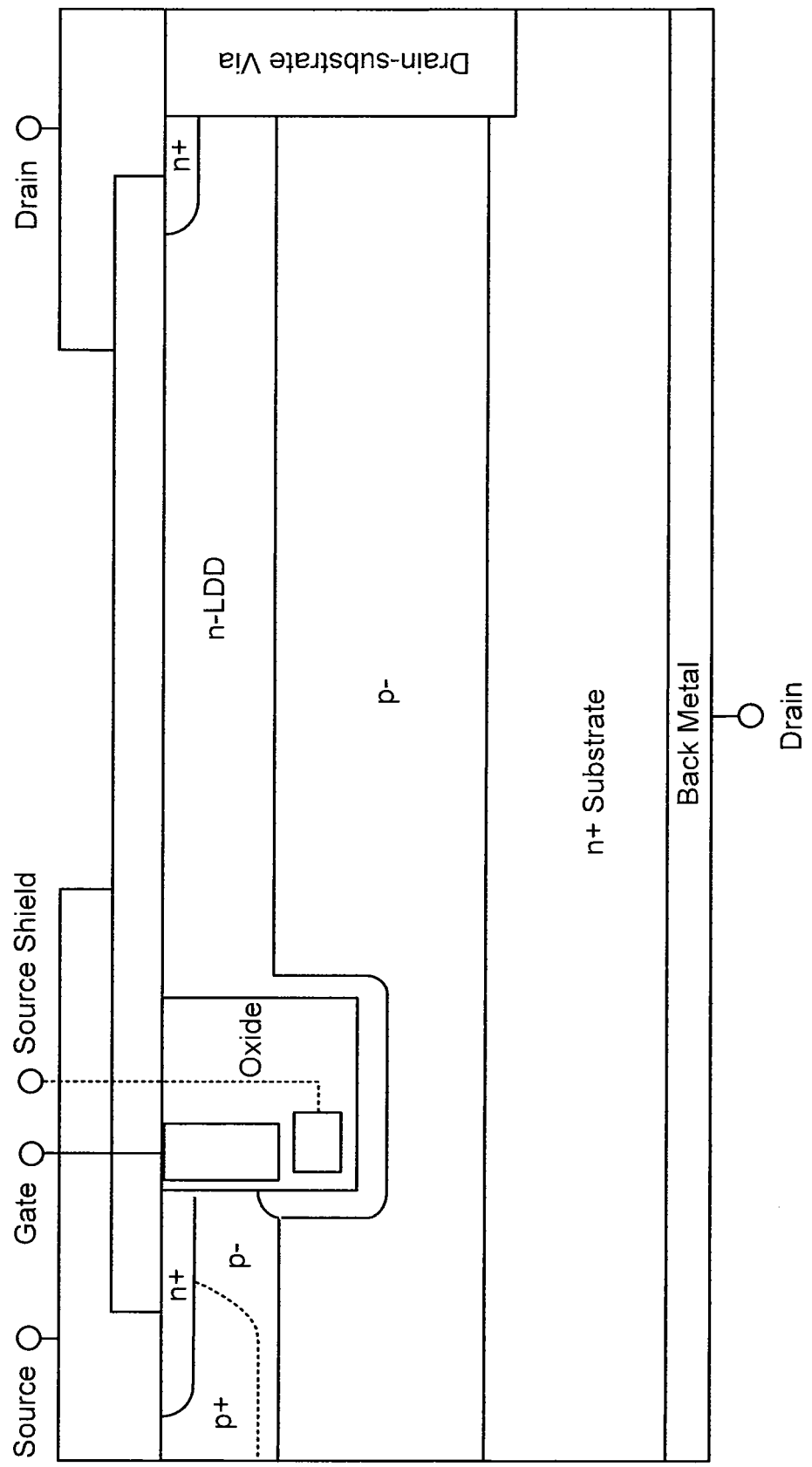

The source-substrate connection and drain-substrate connection may be integrated with any TG-LDMOS structure. As an example, FIGS. 12C and 13C show integration of these connections with the source-shield structure of FIG. 7.

Typically, a connection to the source from a package pin is made through a bond wire. But these bond wires add inductance that may degrade performance. The source-to-substrate via 1210 allows a connection to the source to be made through the back metal 1220, thus reducing this inductance and source-series resistance.

These vias may be manufactured using one or more of several techniques. For example, the vias may be etched chemically or mechanically, by laser drilling, micromachining, or other technique. The vias may then be filled or plated with a conductive material, such as metal. The vias may be insulated or not, depending on the exact configuration of substrate, epitaxial, and other diffusions and implant material.

Figure 14:
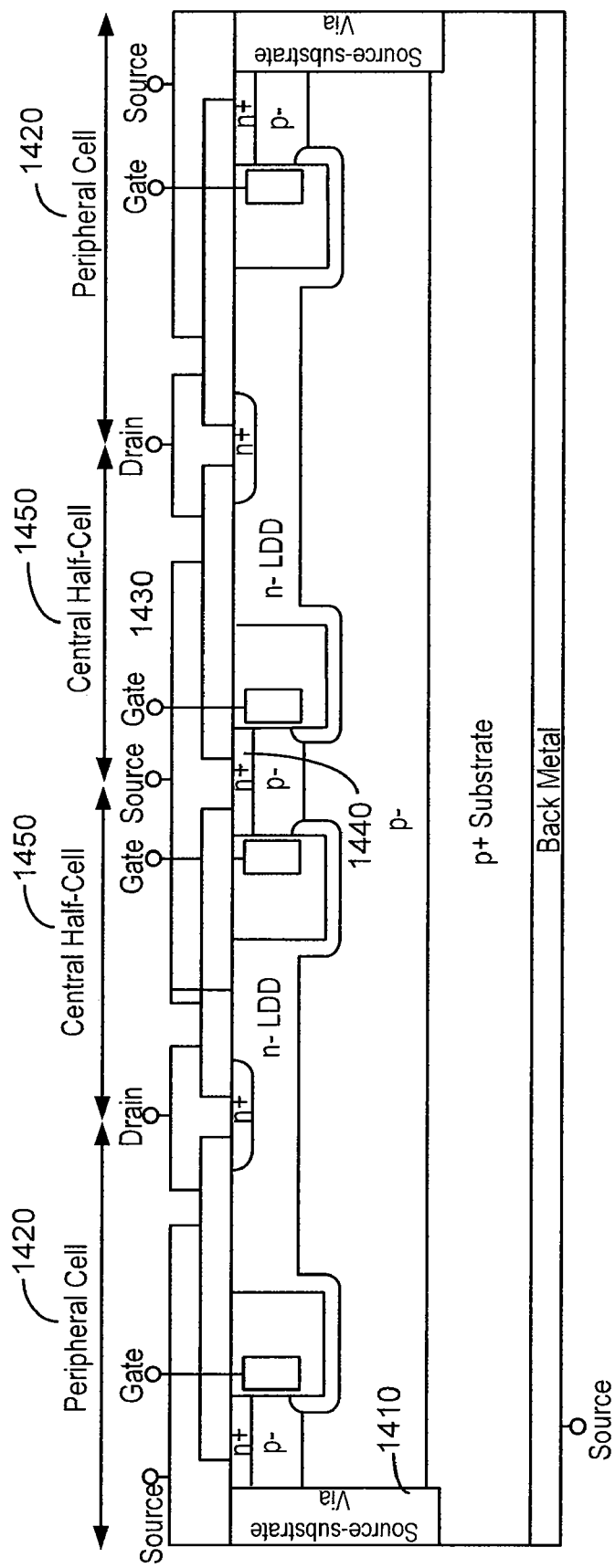
FIG. 14 is a cross section view illustrating how the source-substrate via can be advantageously used to obtain a smaller cell pitch.

FIG. 14 is a cross section view illustrating how the source-substrate via 1410 can be advantageously used to obtain a smaller cell pitch. Similar advantage is obtained by the drain-substrate connection. In FIG. 14, the source-substrate via 1410 is used only in the peripheral cell 1420 to provide the source-to-substrate connection. Surface source interconnections 1430 are used to interconnect to source regions 1440 within the central half-cells 1450. By using such structure, there is no need to have a trench source connection (or lateral diffusion "sinker") in each unit cell. Thus, the pitch of the cell can be substantially reduced. It is to be understood, that although in FIG. 14 only two central half-cells 1450 are shown between the peripheral cells 1420, in practice, many more central half-cells 1450 are present.

Any two or more of the different structural features illustrated in FIGS. 7, 9A, 11, 12A, and 13A may be combined together depending on the desired device characteristics and design goals. A number of different possibilities are shown in FIGS. 15-19. Some of these Figures also illustrate variations in implementation of the basic concepts illustrated in one of more of FIGS. 7, 9A, 11, 12A, and 13A. Many other variations and combinations would be obvious to one of ordinary skill in this art in view of this disclosure.

Figure 15:
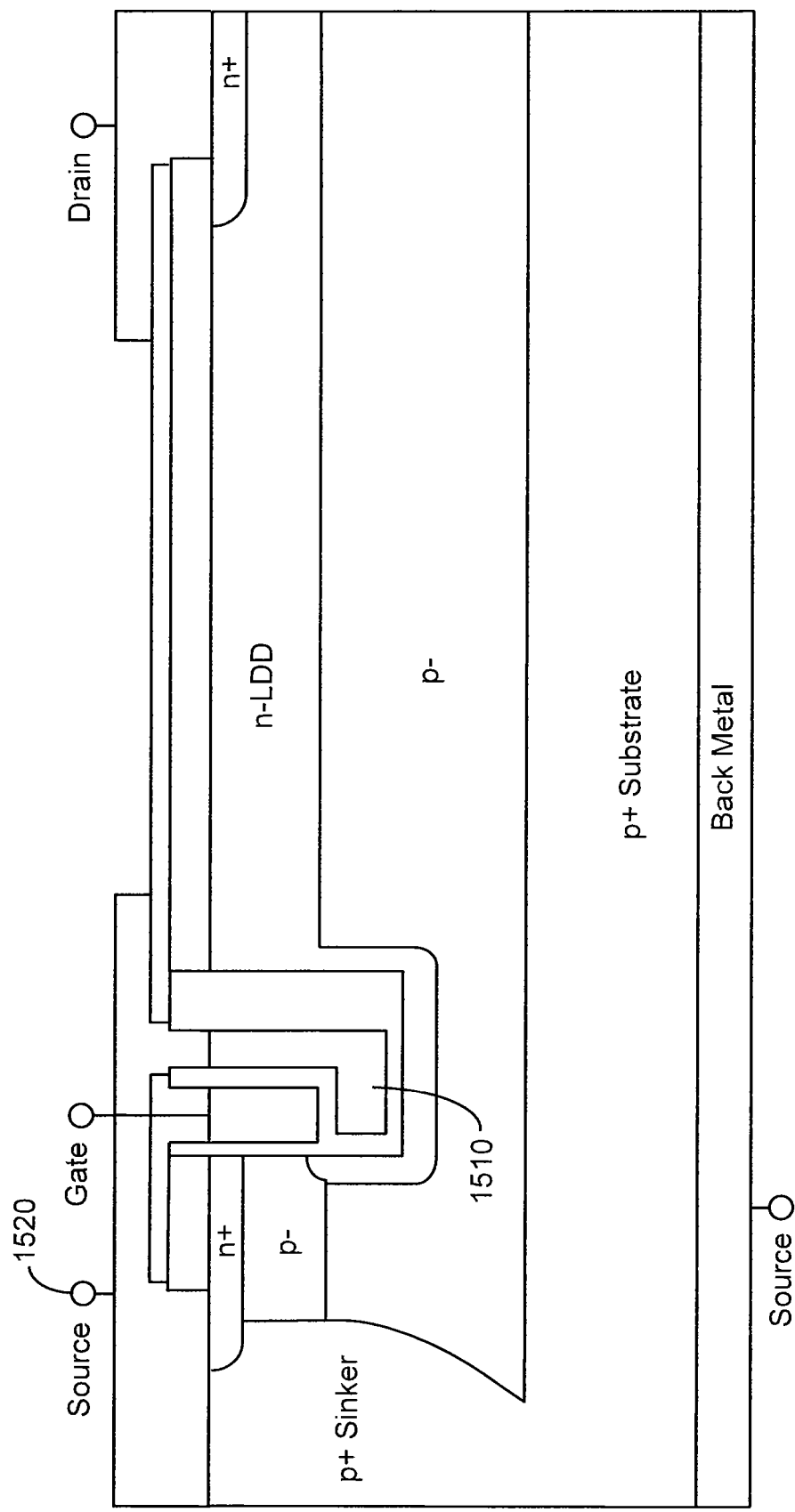
FIG. 15 is a cross section view showing one technique for interconnecting the source-shield to the source terminal.
Figure 16:
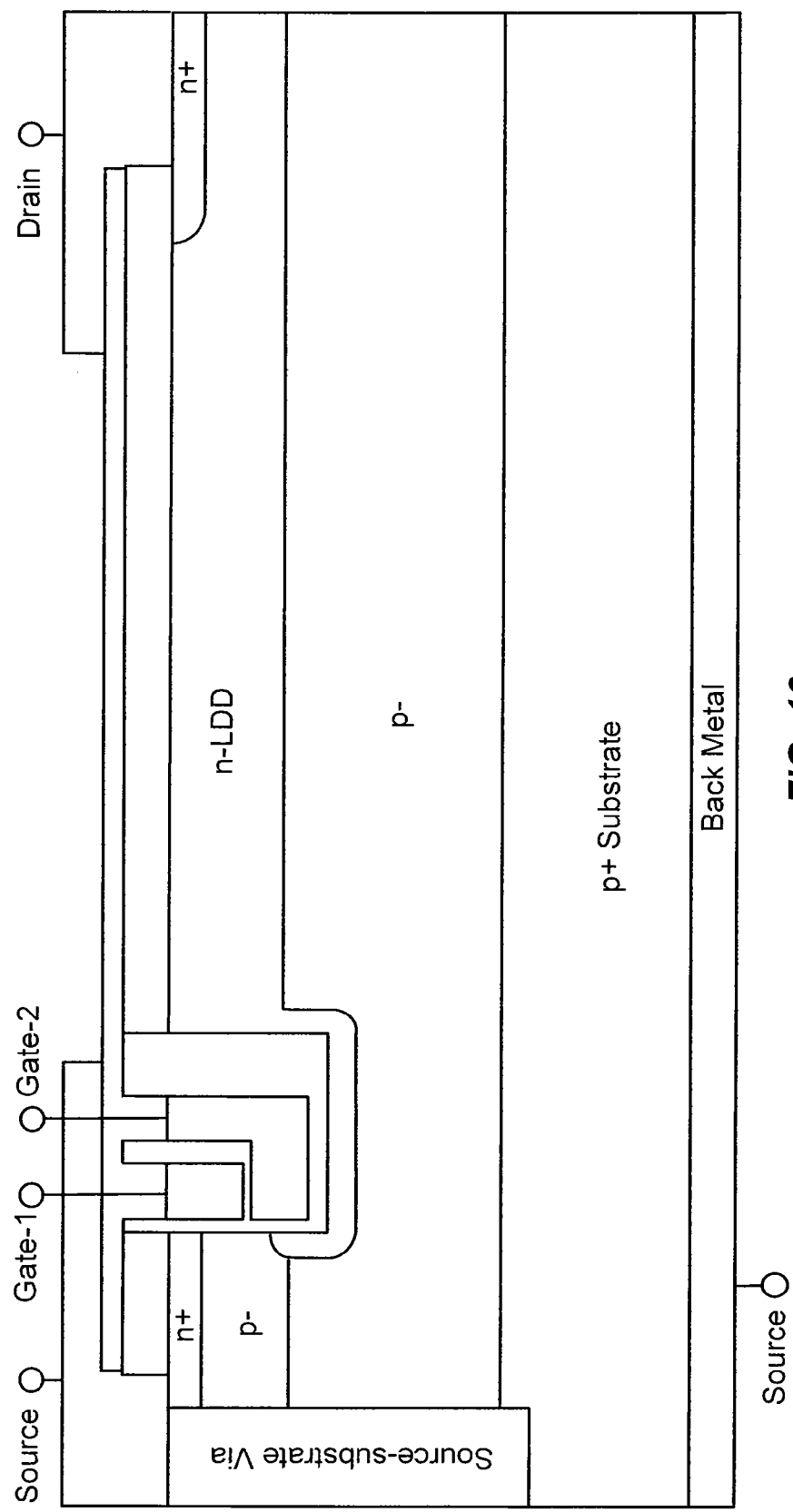
FIG. 16 is a cross section view showing the combination of the dual-gate structure depicted in FIG. 9A with the source to substrate connection technique depicted in FIG. 12A.

FIG. 15 shows one technique for interconnecting the source-shield 1510 to the source terminal 1520. The source-shield 1510 is extended laterally along the bottom of the trench and then vertically to an upper portion of the trench where it is electrically connected to the source electrode 1520. FIG. 16 shows the combination of the dual-gate structure depicted in FIG. 9A with the source to substrate connection technique depicted in FIG. 12A.

Figure 17:
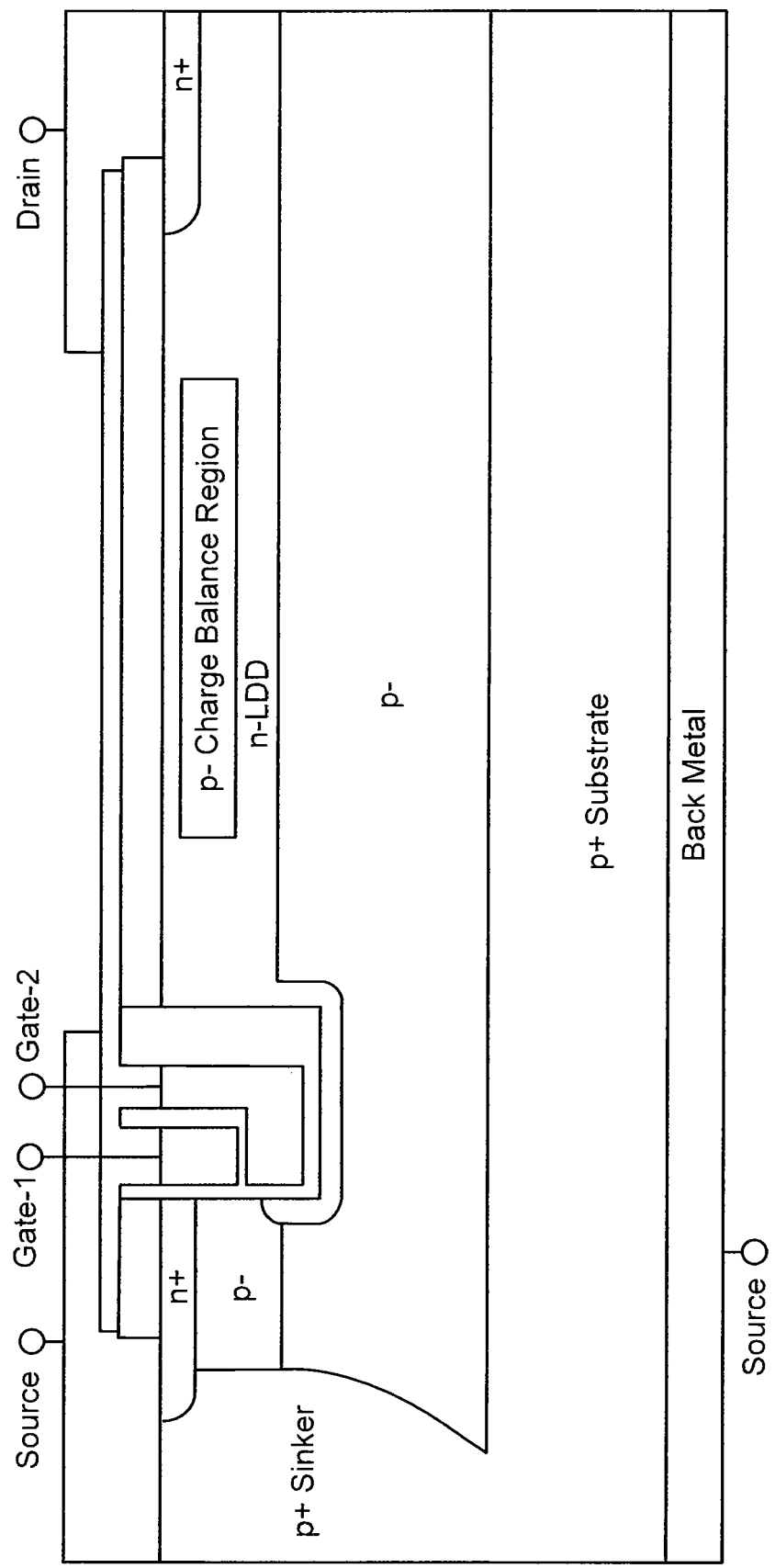
FIG. 17 is a cross section view showing the dual-gate structure of FIG. 9A in combination with the charge balance technique of FIG. 11.
Figure 18:
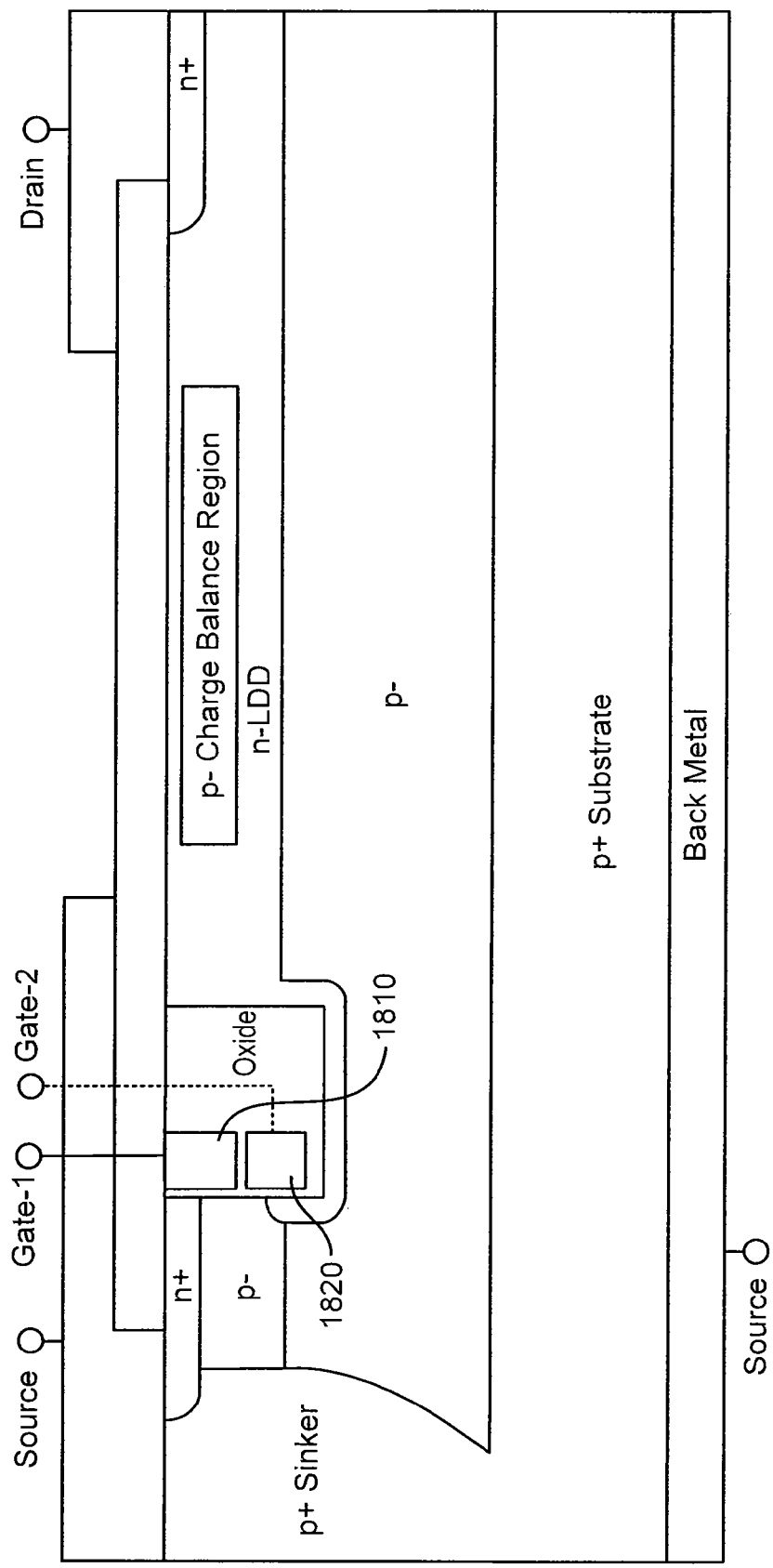
FIG. 18 is a cross section view showing a variation of the dual-gate structure in combination with the charge balance technique of FIG. 11.

FIG. 17 shows the dual-gate structure of FIG. 9A in combination with the charge balance technique of FIG. 11. FIG. 18 shows a variation of the dual-gate structure wherein the lower gate (Gate-2) 1820 does not extend vertically parallel to the upper gate 1810 (although connection to Gate-2 is provided in a third dimension), in combination with the charge balance technique of FIG. 11. By using charge-balancing techniques in combination with the dual-gate or source-shield techniques, a significantly greater breakdown voltage is achieved.

Figure 19:
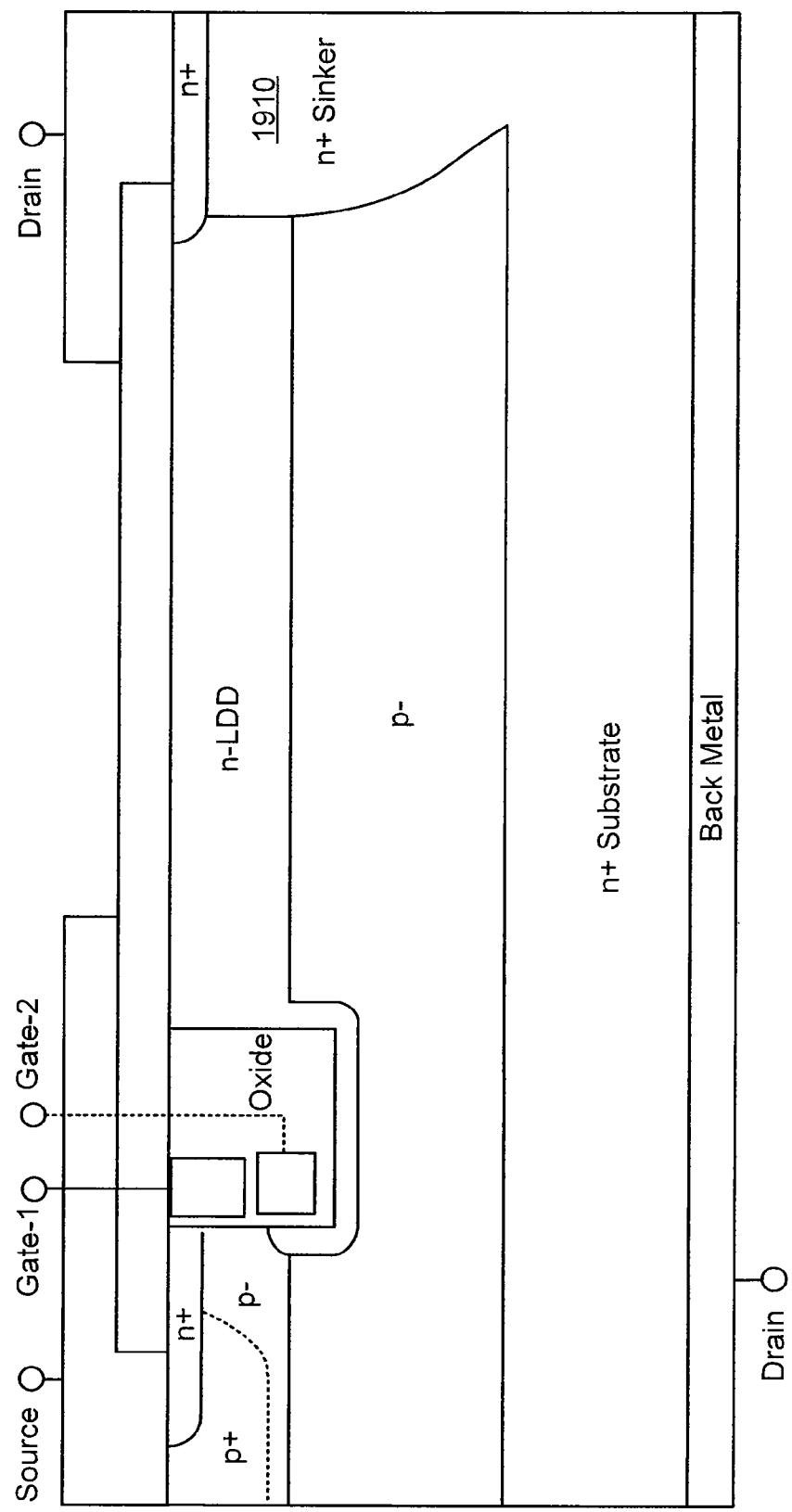
FIG. 19 is a cross section view showing the same variation of the dual-gate structure depicted in FIG. 18 in combination with an n+ drain sinker.

FIG. 19 shows the same variation of the dual-gate structure depicted in FIG. 18 in combination with an n+ drain sinker 1910. In another embodiment, the n+ drain sinker 1910 in FIG. 19 may be replaced with the drain-substrate via 1310 shown in FIG. 13A. Note that the dual-gate structure shown in FIGS. 12 and 13 are easier to manufacture than the structure shown in FIG. 9A.

In the different embodiments described above, it is important to obtain high quality uniform insulating layers in the trench area. The insulator at the corners of a trench typically thinner than other areas because of deposition difficulties (oxide grows faster on a planar surface than on a curved surface), and film stress at the silicon-oxide interface at the corners (concave or convex) is greater. The combination of film stress and thinner oxide lead to less resistance to high electric fields and thus higher leakage current. Use of high-k dielectric can substantially reduces the leakage current. A combination of thermally grown SiO2 and nitride may be used to overcome the leakage problem. Alternatively, a thin high quality high-k dielectric may be used either alone or in combination with, for example, an under-layer of thermally grown oxide. Further, the high-k dielectric may be used only for the gate insulator where thin oxide (e.g., <100 Å) is used for greater transconductance (gm).

The various improvements described herein enable maintaining of the advantages of the LDMOS structure (e.g., better linearity), while increasing the RF power gain and the device breakdown voltage. The DC dynamic losses in a high voltage switching diode translates into the device rise and fall times which in turn are proportional to the Gate to Drain capacitance (Cgd or Qgd, i.e., the Miller capacitance). By greatly reducing Cgd, the rise and fall times are greatly reduced and hence the dynamic losses are greatly reduced. Thus, the dramatic reduction in parasitic capacitance allows safer operation even at fast switching and achieves higher efficiencies at low currents and higher voltages.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A field effect transistor comprising:
    a first silicon region comprising a body region having a first conductivity type, the first silicon region having a top surface;
    a gate-trench region extending from the top surface of the first silicon region into the first silicon region, wherein the gate-trench region has a first sidewall, a bottom, and a second sidewall, the gate-trench region comprising:
        a source-shield region comprising a first conductive region;
        a gate region comprising a second conductive region, the gate region located between the top surface of the first silicon region and the source-shield region;
        a first insulating layer between the gate region and the first sidewall; and
        a second insulating layer between the gate region and the second sidewall, the second insulating layer being thicker than the first insulating layer;
    a highly-doped drain region of a second conductivity type at the top surface of the first silicon region and contacting a drain electrode, the highly-doped drain region being laterally spaced from the gate-trench region, the second conductivity type being opposite to the first conductivity type;
    a lightly-doped drain region of the second conductivity type in the first silicon region, the lightly-doped drain region laterally extending along the top surface of the first silicon region between the second sidewall of the gate-trench region and the highly-doped drain region, and further extending under the bottom of the gate-trench region;
    wherein a portion of the lightly-doped drain region laterally extending along the top surface of the first silicon region extends to a depth shallower than a bottom of the gate-trench region; and
    a source region at the top surface of the first silicon region, the source region comprising a dopant region of the second conductivity type extending along the first sidewall of the gate-trench region.

2. The field effect transistor of claim 1 wherein the first silicon region comprises a substrate of the first conductivity type and an epitaxial layer of the first conductivity type extending over the substrate, the epitaxial layer having a lower doping concentration than the substrate, the field effect transistor further comprising:
    a sinker region of the first conductivity type extending through the epitaxial layer to electrically contact the source electrode along a top surface of the epitaxial layer to the substrate, the sinker region having a higher doping concentration than the epitaxial layer.

3. The field effect transistor of claim 1 wherein the first silicon region comprises a substrate of the first conductivity type and an epitaxial layer of the first conductivity type extending over the substrate, the epitaxial layer having a lower doping concentration than the substrate, wherein the lightly-doped drain region extends in the epitaxial layer.

4. The field effect transistor of claim 1 wherein the lightly-doped drain region forms a PN junction with a portion of the first silicon region.

5. The field effect transistor of claim 1 wherein the first silicon region further comprises a second silicon region having the first conductivity type underlying the body region and the lightly-doped drain region, the second silicon region extending up along lower sidewalls of the gate-trench region.

6. The field effect transistor of claim 1 wherein the lightly doped drain region further extends along the first sidewall of the gate-trench region such that a channel region along the first sidewall between the source region and the lightly doped drain region extends along the vertical dimension in the body region.

7. The field effect transistor of claim 6 wherein the source-shield region is between the gate region and the lightly-doped drain region.

8. The field effect transistor of claim 6 wherein the source-shield region comprises polysilicon.

9. The field effect transistor of claim 6 wherein each of the source-shield region and the gate region comprises polysilicon.

10. The field effect transistor of claim 6 further comprising:

a charge-balance region of the first conductivity type in the lightly-doped drain region.

11. The field effect transistor of claim 10 wherein the charge-balance region extends between the gate-trench region and the highly-doped drain region.

12. The field effect transistor of claim 10 wherein the charge-balance region is fully embedded in the lightly-doped drain region.

* * * * *

UNITED STATES PATENT AND TRADEMARK OFFICE
CERTIFICATE OF CORRECTION

| | | |
|---|---|---|
| PATENT NO. | : 7,576,388 B1 | Page 1 of 1 |
| APPLICATION NO. | : 10/951259 | |
| DATED | : August 18, 2009 | |
| INVENTOR(S) | : Wilson et al. | |

It is certified that error appears in the above-identified patent and that said Letters Patent is hereby corrected as shown below:

In the Claims

Column 14, line 21, in Claim 1, delete "a bottom" and insert --the bottom-- therefore.

Column 14, line 35, in Claim 2, delete "electrode" and insert --region-- therefore.

Column 14, line 57, in Claim 6, delete "the vertical" and insert --a vertical-- therefore.

Signed and Sealed this
Eighteenth Day of February, 2014

Michelle K. Lee
*Deputy Director of the United States Patent and Trademark Office*